US010131802B2

(12) United States Patent
Mesa, Jr. et al.

(10) Patent No.: US 10,131,802 B2
(45) Date of Patent: Nov. 20, 2018

(54) NANOSILICA BASED COMPOSITIONS, STRUCTURES AND APPARATUS INCORPORATING SAME AND RELATED METHODS

(71) Applicant: METASHIELD, LLC, New York City, NY (US)

(72) Inventors: Glenn A. Mesa, Jr., St. George, UT (US); Puruswottam Aryal, St. George, UT (US); Martin Ben-Dayan, New York City, NY (US); William D. Bickmore, St. George, UT (US); Michael Dahlby, Washington, UT (US); Jerrett A. Holdaway, Meridian, ID (US); Jacob Schliesser, Naples, UT (US)

(73) Assignee: Metashield LLC, New York, NY (US)

( * ) Notice: Subject to any disclaimer, the term of this patent is extended or adjusted under 35 U.S.C. 154(b) by 0 days.

(21) Appl. No.: 15/341,615

(22) Filed: Nov. 2, 2016

(65) Prior Publication Data
US 2017/0121538 A1 May 4, 2017

Related U.S. Application Data

(60) Provisional application No. 62/405,132, filed on Oct. 6, 2016, provisional application No. 62/327,160, filed on Apr. 25, 2016, provisional application No. 62/265,156, filed on Dec. 9, 2015, provisional application No. 62/249,628, filed on Nov. 2, 2015.

(51) Int. Cl.
*C09D 7/12* (2006.01)
*C09D 5/00* (2006.01)
*H01L 31/0216* (2014.01)
*H01L 31/048* (2014.01)
*H01L 31/054* (2014.01)
*C03C 17/00* (2006.01)
*C09D 7/61* (2018.01)
*C09D 7/40* (2018.01)
*C08K 3/34* (2006.01)
*C08K 3/08* (2006.01)

(52) U.S. Cl.
CPC .......... *C09D 7/1216* (2013.01); *C03C 17/002* (2013.01); *C03C 17/007* (2013.01); *C09D 5/006* (2013.01); *C09D 7/61* (2018.01); *C09D 7/67* (2018.01); *C09D 7/68* (2018.01); *H01L 31/02168* (2013.01); *H01L 31/0481* (2013.01); *H01L 31/054* (2014.12); *C03C 2217/213* (2013.01); *C03C 2217/45* (2013.01); *C03C 2217/477* (2013.01); *C03C 2217/478* (2013.01); *C03C 2217/479* (2013.01); *C03C 2217/73* (2013.01); *C03C 2217/732* (2013.01); *C03C 2218/11* (2013.01); *C03C 2218/113* (2013.01); *C03C 2218/32* (2013.01); *C08K 3/34* (2013.01); *C08K 2003/0806* (2013.01); *C08K 2003/0812* (2013.01); *C08K 2003/0831* (2013.01)

(58) Field of Classification Search
None
See application file for complete search history.

(56) References Cited

U.S. PATENT DOCUMENTS

| | | | |
|---|---|---|---|
| 5,015,523 A | 5/1991 | Kawashima et al. | |
| 5,243,769 A | 9/1993 | Wang et al. | |
| 5,385,955 A | 1/1995 | Tarshiani et al. | |
| 5,976,511 A | 11/1999 | Ohtsu et al. | |
| 6,214,416 B1 | 4/2001 | Sakagami et al. | |
| 6,432,191 B2 | 8/2002 | Schutt | |
| 6,485,838 B1 | 11/2002 | Shimada et al. | |
| 6,638,600 B2 | 10/2003 | Gazo et al. | |
| 6,905,772 B2 | 6/2005 | Shoup et al. | |
| 6,929,826 B1 | 8/2005 | Parkhill et al. | |
| 7,078,076 B2 | 7/2006 | Maze et al. | |
| 7,153,759 B2 | 12/2006 | Wei et al. | |
| 7,405,466 B2 | 7/2008 | Wei et al. | |
| 7,427,442 B2 | 9/2008 | Albert et al. | |
| 7,473,721 B2 | 1/2009 | Harada et al. | |
| 7,875,318 B2 | 1/2011 | Borovik et al. | |

(Continued)

FOREIGN PATENT DOCUMENTS

| | | |
|---|---|---|
| DE | 19813709 A1 | 9/1999 |
| EP | 0305833 B1 | 12/1992 |

(Continued)

OTHER PUBLICATIONS

Boudot, Mickael et al. "Sol-Gel Based Hydrophobic Antireflective Coatings on Organic Substrates: A Detailed Investigation of Ammonia Vapor Treatment (AVT)". Sorbonne Universités, UPMC Univ Paris 06, CNRS, Collège de France, UMR 7574, Chimie de le Matière Condensée de Paris, F-75005 Paris, France, Polyrise SAS, F-33607 Pessac, France, ACS Publication, American Chemical Society, dx.doi.org/10.1021/cm403787v | Chem. Mater. 2014, 26, 1822-1833.

(Continued)

*Primary Examiner* — Sheeba Ahmed
(74) *Attorney, Agent, or Firm* — Durham Jones & Pinegar; Christopher Wight; Bradley Jensen

(57) ABSTRACT

Silica based compositions that may be used coatings, films or other cast structures, as well as related methods and resulting structures are provided. In one embodiment, a hybrid nanosilica (HNS) composition includes tetraethylorthosilicate (TEOS), methyl triethoxysilane (MTEOS) and glycidoxypropyltrimethoxysilane (GPTMS). The composition may be used as a coating to provide various types of protection and device performance enhancement. For example, the composition may be used for impact protection or corrosion resistance. In one particular embodiment, optically enhancing nanoparticles may be dispersed throughout the HNS material and used as an antireflective coating (ARC) for various optical purposes.

18 Claims, 8 Drawing Sheets

(56) References Cited

U.S. PATENT DOCUMENTS

| | | |
|---|---|---|
| 8,303,704 B2 | 11/2012 | Im et al. |
| 8,476,528 B2 | 7/2013 | Hodgson et al. |
| 8,540,814 B2 | 9/2013 | Vreugdenhil et al. |
| 8,728,579 B2 | 5/2014 | Asuka et al. |
| 8,771,462 B2 | 7/2014 | Sjong |
| 8,889,812 B2 | 11/2014 | Albert et al. |
| 8,921,441 B2 | 12/2014 | Bae et al. |
| 8,932,717 B2 | 1/2015 | Lee et al. |
| 2004/0071960 A1 | 4/2004 | Weber et al. |
| 2006/0167147 A1 | 7/2006 | Asgari |
| 2006/0211786 A1 | 9/2006 | Liu et al. |
| 2010/0151257 A1 | 6/2010 | Suzuki et al. |
| 2010/0159144 A1 | 6/2010 | Standke et al. |
| 2010/0190010 A1 | 7/2010 | Treadway |
| 2011/0248223 A1 | 10/2011 | Zheng |
| 2011/0256368 A1 | 10/2011 | McCormick et al. |
| 2011/0281118 A1 | 11/2011 | Wan et al. |
| 2011/0308989 A1 | 12/2011 | Berrux et al. |
| 2012/0164458 A1* | 6/2012 | Biteau .................. G02B 1/105 428/447 |
| 2012/0247641 A1 | 10/2012 | Ruggiero et al. |
| 2013/0011665 A1 | 1/2013 | Song et al. |
| 2013/0293835 A1 | 11/2013 | Saint-Lu et al. |
| 2013/0319522 A1 | 12/2013 | Koike et al. |
| 2014/0174534 A1 | 6/2014 | Bickmore |
| 2015/0024145 A1 | 1/2015 | Bockmeyer et al. |
| 2015/0037563 A1 | 2/2015 | Bockmeyer et al. |
| 2015/0136712 A1 | 5/2015 | Carr et al. |
| 2015/0355387 A1 | 12/2015 | Hazle et al. |
| 2016/0046823 A1 | 2/2016 | Barrera et al. |
| 2016/0083623 A1 | 3/2016 | Wczasek et al. |
| 2016/0145444 A1 | 5/2016 | Qiu |
| 2016/0185978 A1 | 6/2016 | Gittens et al. |
| 2016/0251516 A1 | 9/2016 | Sorensen et al. |
| 2017/0037259 A1 | 2/2017 | Wang |

FOREIGN PATENT DOCUMENTS

| | | |
|---|---|---|
| WO | 2014191481 A1 | 12/2014 |
| WO | WO2015058778 A1 | 4/2015 |
| WO | WO2015088808 A1 | 6/2015 |
| WO | WO2015159060 A1 | 10/2015 |
| WO | WO2015179152 | 11/2015 |
| WO | WO2016/005782 A1 | 1/2016 |
| WO | WO2016037707 A1 | 3/2016 |

OTHER PUBLICATIONS

Cai, Shuang et al. "Hydrophobic-oleophobic antireflective film with excellent optical property prepared by a imple sol-gel route". a Key Laboratory of Green Chemistry & Technology,College of Chemistry,Sichuan University,Chengdu 610064,China b Research Center of Laser Fusion,China Academy of Engineering Physics,Mianyang621900,China. Materials Letters 156 (2015)14-16. www.elsevier.com/locate/matlet.

Cai, Shuang et al. "Sol-Gel Preparation of Hydrophobic Silica Antireflective Coatings with Low Refractive Index by Base/Acid Two-Step Catalysis". Key Laboratory of Green Chemistry & Technology, College of Chemistry, Sichuan University, Chengdu 610064, China. Research Center of Laser Fusion, China Academy of Engineering Physics, Mianyang 621900, China. 2014 ACS Publications, American Chemical Society, dx.doi.org/10.1021/am501972y | ACS Appl. Mater. Interfaces 2014, 6, 11470-11475. www.acsami.org.

Grundwurmwer, M. et al."Sol-gel derived erosion protection coatings against damage caused by liquid impact". Technische Universitat Munchen, Department of Macromolecular Chemistry, Munich, Germany EADS Corporate Research Centre, Department of Surface and Chemical Engineering, Munich, Germany Received Aug. 14, 2006; received in revised form Dec. 7, 2006; accepted Dec. 8, 2006. Wear 263 (2007) 318-329. Available online May 23, 2007 www.sciencedirect.com.

Innocenz, Plinio et al. "Hybrid Organic-Inorganic Sol-Gel Materials Based on Epoxy-Amine Systems". Laboratorio di Scienza dei Materiali e Nanotecnologie, Nanoworld Institute, Dipartimento di Architettura e Pianificazione, Universit'a di Sassari, Palazzo Pou Salid, Piazza Duomo 6, 07041 Alghero (Sassari), Italy. Yoko Toshinobu , Laboratory of Inorganic Photonics Materials, Division of Materials Chemistry, Institute for Chemical Research, Kyoto University, Uji, Kyoto-Fu 611-0011, Japan. Journal of Sol-Gel Science and Technology 35, 225-235, 2005.

Kasemann, R. et al. "Coatings for mechanical and chemical protection based on organic-inorganic sol-gel nanocomposites". Institut fur Neue Materialien gem. GmbH, Im Stadtwald, Geb. 43, D-66123 Saarbrucken, Germany. New J. Chem., 1994, 18, 1117-1123. New Journal of Chemistry, vol. 18, N° 10-1994.

Balgude, Dinesh et al. "Sol-gel derived hybrid coatings as an environment friendly surface treatment for corrosion protection of metals and their alloys". Department of Polymer and Surface Engineering, Institute of Chemical Technology, Nathalal Parekh Marg, Matunga (E), Mumbai 400019, India Received: May 12, 2012 / Accepted: Jul. 3, 2012 / Published online: Jul. 14, 2012. J Sol-Gel Technol (2012) 64:124-134.

PCT International Search Report for PCT International Patent Application No. PCT/US2016/060089 dated Mar. 30, 2017.

\* cited by examiner

NANOSILICA BASED COMPOSITIONS, STRUCTURES AND APPARATUS INCORPORATING SAME AND RELATED METHODS

CROSS-REFERENCE TO RELATED APPLICATIONS

This application claims benefit to U.S. Provisional Application No. 62/249,628, filed Nov. 2, 2015, U.S. Provisional Application No. 62/265,156, filed Dec. 9, 2015, U.S. Provisional Application No. 62/327,160, filed Apr. 25, 2016, and U.S. Provisional Application No. 62/405,132, filed Oct. 6, 2016, the disclosures of each of which are incorporated by references herein in their entireties.

TECHNICAL FIELD

The present invention relates to nanosilica based compositions which may be used for a variety of purposes and in a variety of environments including use as protective or performance enhancing coatings.

BACKGROUND

Protective coatings are used in a variety of industries for a myriad of purposes. In some instances, coatings may simply provide environmental protection from dirt or debris. In other instances, a hermetic seal may be provided by a coating in order to prevent moisture or other environmental elements from accessing otherwise sensitive components. For example, some components may include materials that are subject to corrosive degradation (e.g., oxidation, galvanic corrosion, etc.).

In yet other examples, it is desirable to protect surfaces of a structure or a device from incurring scratching or other surface damage, whether due to anticipated use or due to accidental impact. For example, it is desirable to protect the screen of a smartphone, tablet or touchscreen of other computing devices from potential scratching or even cracking and breaking due to impact.

In other examples, materials may be exposed to harmful ultraviolet (UV) radiation such as may be experienced due to prolonged exposure to the sun. In various circumstances, it may be desirable to protect the exposed materials from such UV radiation without unduly altering the appearance of the structure or device (e.g., without painting or placing some other opaque covering over the device or structure).

In yet other situations, it is desirable to provide a coating that provides performance enhancement for a given device. For example, it may be desirable to provide an antireflective coating or some other optically enhancing coating to a desired structure or device. One particular example includes the use of coatings for photovoltaic (PV) modules, also referred to as solar panels.

The prior art includes a variety of paints, epoxies, varnishes, waterproofing substances, and various materials which have been used in an attempt to dissipate impact force, resist scratching, provide chemical corrosion resistance, prevent UV degradation of the coating or the material which is coated, and for other related purposes. However, it is desirable in the industry to provide improved materials for various protective and performance enhancing purposes.

SUMMARY

The present disclosure provides various embodiments of silica based compositions, methods of preparing and using such compositions, and structures and devices incorporating such compositions. In accordance with one embodiment, a structure is provided comprising a substrate and a coating on a first surface of the substrate. The coating comprises a hybrid nanosilica (HNS) material comprising tetraethylorthosilicate (TEOS), methyl triethoxysilane (MTEOS) and glycidoxypropyltrimethoxysilane (GPTMS).

In accordance with one embodiment, the coating may further include a plurality of optically enhancing nanoparticles (OENPs) dispersed in the HNS material.

In one embodiment, the plurality of OENPs include at least one of the group consisting of gold nanoparticles (NPs), silver NPs, aluminum NPs and silicon NPs.

In one embodiment, the OENPs include spherical gold nanoparticles exhibiting an average diameter of approximately 30 nanometers (nm) to approximately 200 nm.

In one embodiment, the OENPs include spherical silicon nanoparticles exhibiting an average diameter of approximately 30 nanometers (nm) to approximately 200 nm.

In one embodiment, the OENPs include silver nanoplates exhibiting an average height of approximately 5 nanometers (nm) to approximately 100 nm and an average diameter of approximately 30 nm to approximately 200 nm.

In one embodiment, the OENPs include spherical silver nanoparticles exhibiting an average diameter of approximately 80 nanometers (nm) to approximately 200 nm.

In one embodiment, the OENPs include aluminum nanoparticles exhibiting an average diameter of approximately 10 nanometers (nm) to approximately 200 nm.

In one embodiment, the center-to-center distance between the OENPs is approximately 100 nm to 700 nm.

In accordance with one embodiment, the HNS material comprises a material that transitions from sol to gel at a temperature of approximately 60° C. or less.

In one embodiment, the HNS material comprises a material that transitions from sol to gel at a temperature of approximately 20° C. to approximately 110° C.

In one embodiment, the HNS material comprises a material that transitions from sol to gel at a temperature of approximately 150° C. or less.

In one embodiment, the substrate comprises a glass material.

In one embodiment, the substrate comprises a material including at least one of the group consisting of: wood, metal, polymer, ceramic and semiconducting material.

In one embodiment, the coating is configured as an antireflective coating.

In one embodiment, the structure includes a second surface opposite of the first surface, and wherein the second surface is anticipated to receive an external impact.

In one embodiment, the coating further includes a plurality of nanoparticles embedded in the HNS material, the plurality of nanoparticles comprising at least one of cerium oxide, titanium oxide and zinc oxide.

In one embodiment, the coating further comprises at least one of a hydrophobic agent, a hydrophilic agent and an oleophobic agent.

In accordance with another embodiment of the present disclosure, a composition is provided. The composition includes tetraethylorthosilicate (TEOS), methyl triethoxysilane (MTEOS) and glycidoxypropyltrimethoxysilane (GPTMS).

In one embodiment, the composition further comprises (3-aminopropyl)triethoxysilane (ATEOS).

In one embodiment, TEOS is present in the amount of approximately 5-50 mole %.

In one embodiment, MTEOS is present in the amount of approximately 50-90 mole %.

In one embodiment, GPTMS is present in the amount of approximately 5-25 mole %.

In one embodiment, TEOS is present in the amount of approximately 20-25 mole %.

In one embodiment, MTEOS is present in the amount of approximately 50-60 mole %.

In one embodiment, GPTMS is present in the amount of approximately 15-20 mole %.

In one embodiment, the TEOS, the MTEOS and the GPTMS form a matrix and wherein a plurality of optically enhancing nanoparticles are dispersed throughout the matrix.

In one embodiment, the composition further comprises at least one of a hydrophobic agent, a hydrophilic agent and an oleophobic agent.

In one embodiment, the composition further comprises water, alcohol and acid. In one embodiment, the acid includes acetic acid.

In accordance with another embodiment of the present disclosure, a solar energy apparatus is provided. The solar energy apparatus includes at least one photovoltaic cell and a coating on a portion of the solar energy apparatus, the coating including a hybrid nanosilica (HNS) material.

In one embodiment, the solar energy apparatus further comprises a plurality of optical enhancing nanoparticles dispersed through the HNS material.

In one embodiment, the coating is disposed directly on a surface of the photovoltaic cell.

In one embodiment, the solar energy apparatus further comprises an antireflective coating disposed on the photovoltaic cell, wherein the coating of HNS material is disposed on the antireflective coating. In one embodiment, the antireflective coating comprises at least one of silicon nitride and titanium dioxide.

In one embodiment, the plurality of OENPs comprise at least one of the group consisting of gold nanoparticles silver NPs, aluminum NPs and silicon NPs.

In one embodiment, the solar energy apparatus further comprises a substantially transparent substrate disposed over the photovoltaic cell, wherein the coating is disposed on the substantially transparent substrate.

In accordance with another embodiment of the present disclosure, a method of manufacturing a solar energy apparatus is provided. The method comprises providing a photovoltaic (PV) module, disposing a hybrid nanosilica (HNS) liquid coating on a portion of the PV module, and causing the liquid coating to transition to a gel state at a temperature of approximately 150° C. or less.

In one embodiment, the method further includes dispersing a plurality of optical enhancing nanoparticles within the HNS material prior to disposing the liquid coating on a portion of the PV module.

In one embodiment, disposing a liquid coating includes disposing the liquid coating on a surface of a photovoltaic cell of the PV module.

In one embodiment, disposing a liquid coating includes disposing the liquid coating over an antireflective coating disposed on a surface of a photovoltaic cell of the PV module.

In one embodiment, disposing a liquid coating includes disposing the liquid coating on a surface of a cover glass of the PV module.

In one embodiment, the method further includes causing the liquid coating to transition to a gel state at a temperature of approximately 20° C. to approximately 110° C.

In one embodiment, the method further includes causing the liquid coating to transition to a gel state at a temperature of approximately 60° C. or less.

In accordance with another embodiment of the present disclosure, a method of coating a substrate is provided. The method comprises preparing a first mixture of water and alcohol; preparing a second mixture by adding, sequentially, tetraethylorthosilicate (TEOS), methyl triethoxysilane (MTEOS) and glycidoxypropyltrimethoxysilane (GPTMS) to the first mixture and stirring the second mixture until the second mixture is substantially homogenous; and applying the second mixture to a surface of a substrate.

In one embodiment, the method further includes adding acid to the second mixture prior to applying the second mixture to a surface of a substrate. In one embodiment, adding acid to the second mixture includes adding acetic acid. In one embodiment, adding acid to the second mixture includes adding acid in an amount to provide the second mixture with a pH of approximately 3.5.

In one embodiment, TEOS is added in the amount of approximately 5-50 mole %.

In one embodiment, MTEOS is added in the amount of approximately 50-90 mole %.

In one embodiment, GPTMS is added in the amount of approximately 5-25 mole %.

In one embodiment, TEOS is present in the amount of approximately 20-25 mole %.

In one embodiment, MTEOS is present in the amount of approximately 50-60 mole %.

In one embodiment, GPTMS is present in the amount of approximately 15-20 mole %.

In one embodiment, applying the second mixture to a surface of a substrate includes applying the second mixture to a glass substrate.

In one embodiment, applying the second mixture to a surface of a substrate includes applying the second mixture to at least one of a metal substrate, a wood substrate, a polymer substrate, a semiconducting substrate and a ceramic substrate.

In one embodiment, the method further includes dispersing a plurality of optical enhancing nanoparticles in the second mixture prior to applying the second mixture to a substrate.

In one embodiment, the substrate is anticipated to receive an impact on a second surface opposite the surface to which the second mixture is applied.

In one embodiment, applying the second mixture to a surface of a substrate includes at least one of spraying, rolling, molding, dipping, pouring, spin coating or blade coating the second mixture onto the surface of the substrate.

In one embodiment, the method further includes adding at least one of a hydrophobic agent, a hydrophilic agent and an oleophobic agent to the second mixture.

It is noted that features, aspects or elements of one embodiment may be combined with features, aspects or elements of other embodiments.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
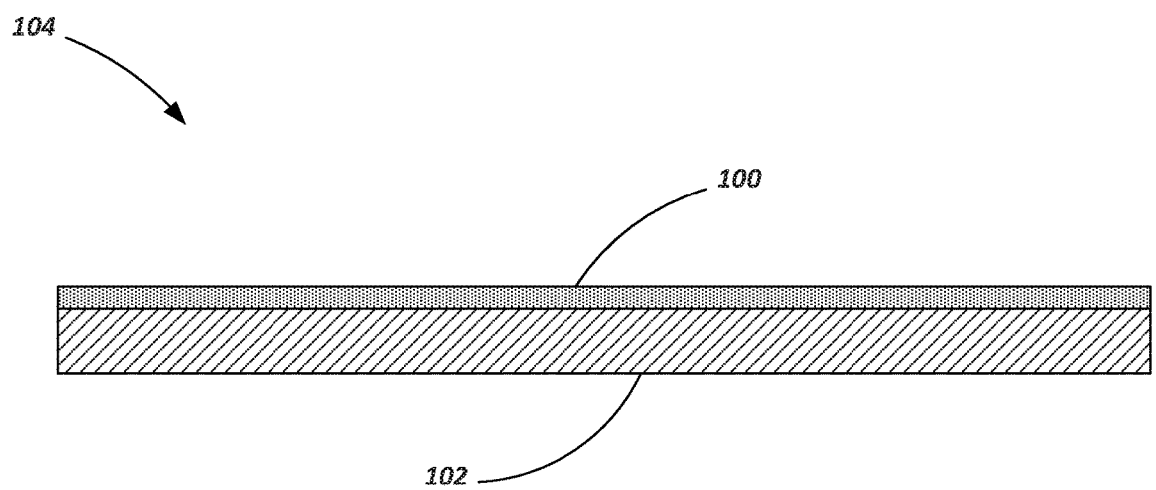
FIG. 1 is a cross-sectional view of a coating on a substrate in accordance with an embodiment of the present disclosure.

As used herein, a nanoparticle (NP) is a small, discrete object whose properties, including optical properties, can be characterized using bulk response functions of the same material. The small size of NPs is relative to the optical wavelength. While some authors restrict the definition of a NP to objects which are at most a few hundred nanometers in size, others may consider particles which are as large as 10,000 nanometers as NPs. NPs which are between 1 and 100 nanometers are generally classified as fine NPs. Molecules are not considered to be NPs.

The present disclosure includes embodiments of what may be termed a hybrid nanosilica (HNS) composition or material. This term (i.e., HNS) embraces and includes other terms that may be used in association with the presently disclosed materials including terms such as "epoxoid", nanosilica epoxoid (NSE), or silica based "epoxy-like" materials. The HNS materials described herein include compositions which may replace and/or enhance many conventional materials. They can be used to form coatings that are unlike conventional petroleum based polymers, varnishes, lacquers or paints in that the HNS coatings are composed of chains of organically substituted silica chemically linked together to form an extensive organic-inorganic matrix. The resultant solution is a highly transparent liquid that under proper conditions undergoes a sol-gel morphological transformation causing it to harden into a solid glass-like film. Compositions described herein may be used as a coating or may be used to form a cast, molded, or other stand-alone structure. Various novel characteristics, including impact resistance, are further described in patent applications previously incorporated by reference.

In some embodiments, the HNS composition (or compound) may serve as a matrix for other nanoparticles such as, for example, metallic and or semiconductor nanoparticles, such that the embedded nanoparticles are spaced with more predictable uniformity and with reduced agglomeration. In some embodiments, the embedded nanoparticles may include what are termed as optically enhancing nanoparticles (OENPs).

In accordance with one embodiment, the silica nanoparticles used to form the matrix may be formed using a sol-gel method (e.g., acid or base catalyzed) using tetraethylorthosilicate (TEOS), methyltrimethoxysilane (MTEOS), and (3-glycidyloxypropyl)trimethoxysilane (GPTMS). The TEOS, MTEOS, and GPTMS may go through a hydrolysis and then a condensation reaction to form a silica based matrix with methyl and epoxide functional groups (see Chemical Expression 1 below). These epoxide functional groups may be used in conjunction with diamine or amine that may include, for example, 1,4-butyldiamine (BDA) to link together. (See Chemical Expression 2 below. Note that only half of the cross-linking reaction is shown for purposes of convenience and clarity). BDA has two amine groups on either end of the molecule, and each amine group can react with an epoxide group to attach the HNS in which other materials may be dispersed or embedded as discussed below.

CHEMICAL EXPRESSION 1

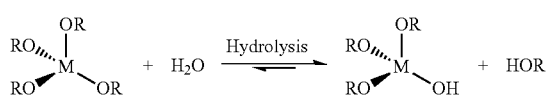

CHEMICAL EXPRESSION 2

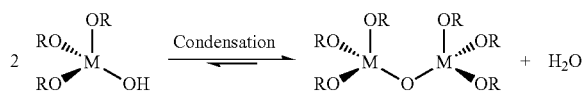

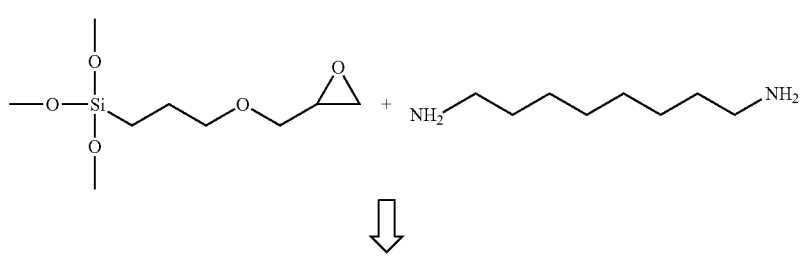

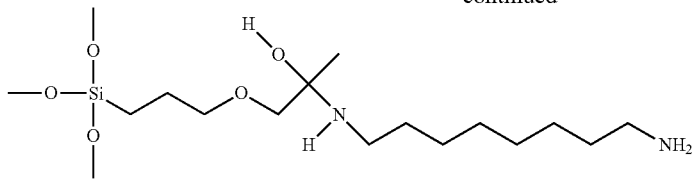

In one embodiment, the HNS compound is a complex mixture of organically-substituted silica chains (i.e. acid catalyzed) chemically linked together to form an extensive organic-inorganic matrix. In another embodiment, organically-substituted silica nanoparticles (i.e. base catalyzed) and an amine cross linker (e.g. a diamine or an alkoxy silane featuring an amine group that reacts with the epoxide functional group on GPTMS) are combined to create the organic-inorganic silica network. In some embodiments, the HNS compound is a combination of silica ingredients which are liquid prior to and during application of the compound to a given surface (e.g. a glass substrate), becoming solid after coating the structure and being exposed to relatively low temperatures (e.g. temperatures associated with ordinary sunlight). This is also known as a sol-gel change of state.

The sol-gel process begins with monomer hydrolysis followed by condensation between two or more monomers to form oligomers consisting of several silicon and oxygen atoms. As condensation continues, the resulting morphology is determined by the pH of the solution. Under acidic conditions (i.e. pH less than 7), condensation proceeds via oligomers linking together to form long chains, whereas under basic conditions (i.e. pH greater than 7) condensation proceeds in a fashion where the oligomers grow independently to form discrete particles. Both acidic and basic preparations are amenable to film formation. However, films prepared from basic solutions with discrete particles tend to yield rough, brittle films. This challenge can be overcome with the use of a crosslinker to improve inter-particle bonding.

Unlike conventional petroleum-based polymers, the resulting coating is very hard, durable, and highly resistant to sunlight degradation. In one embodiment, the coating exhibits a hardness of at least approximately 5.0 on the Mohs hardness scale. In another embodiment, the coating may exhibit a hardness of approximately 5.5 to approximately 6.5 on the Mohs hardness scale, or even greater. Stated another way, in some embodiments, the coating may exhibit a hardness that is similar to that of steel. Additionally, the coating provides substantial abrasion resistance, as shown through sand blasting and other simulated environments. Thus, in accordance with certain embodiments of the present disclosure, HNS coatings and films are capable of providing a highly transparent surface through which light may be efficiently transmitted despite exposure to various environmental conditions. In its native form, HNS coatings or films are highly transparent across a wide sector of the solar spectrum, ranging from near-infrared to ultraviolet, and including the UV-a and UV-b spectra.

In some embodiments, hydrophobic, hydrophilic or oleophobic chemistry may further be added to the HNS compound. For example, methyl triethoxysilane, (3-glycidyloxypropyl) trimethoxysilane, hexamethyldisilazane or other organic silanes may be added for purposes of providing a material that exhibits hydrophobic characteristics. In another example, poly(ethylene glycol) silane or other similar chemicals may be added for purposes of providing a composition with hydrophilic characteristics. As discussed further hereinbelow, the use of hydrophobic, hydrophilic and/or oleophobic additives has been shown to decrease the buildup of precipitation deposited minerals and reduce the tendency of water to form a bead on a given surface (e.g., from precipitation or dew). Hydrophobic coatings reduce the volume of water on a given surface. Likewise, an oleophobic coating reduces the volume of oil on a given surface. The hydrophilic coatings help spread out water with a low contact angle between the surface and the water. In all cases (hydrophilic, hydrophobic, and oleophobic) the residual mineralization or negative byproducts will be minimized compared to structures and devices without a similar coating.

In one particular embodiment, the above chemistry is altered by adding hydrophobic elements such as methyltriethoxysilane, vinyltriethoxysilane, octyltriethoxysilane, phenyltriethoxysilane or any other silane precursor with hydrophobic characteristics. In another embodiment of the present disclosure, the above chemistry is additionally modified (or alternatively modified) by replacing tetraethyl orthosilicate with tetramethyl orthosilicate.

In one particular embodiment, TEOS, GPTMS, and a hydrophobic silane (HS) are combined in a beaker containing a 50/50 mix (by volume) of deionized water and ethanol. The ratio of TEOS:GPTMS:HS is 4:1:4. The concentration of the silane precursors equals 3% of the total solution. Acetic acid of 0.05 molar concentration is added to the solution to catalyze the synthesis of silica nanoparticles.

In one embodiment the water to ethanol volume ratio is 1:2 and the molar ratio of water to siloxane is 63:1.

In another embodiment, TEOS, GPTMS, and MTEOS are combined at a molar ratio of 3:2:7 along with enough acetic acid to form a homogenous solution with a 3.5 pH.

In one embodiment, after the HNS has completed synthesizing, it can be added to a solution of isopropanol, 1-propanol and 1-butanol to dilute the solution for spray coating. A surfactant may optionally be added to the solution at this point as well to assist in the inhibition of large NPs from agglomerating when these large NPs are suspended in the HNS matrix.

The HNS coating may comprise a siloxane solution containing GPTMS. When the solution is ready to be applied to a component surface (e.g., a cover glass/glazing surface), a diamine, such as 1,8-diaminoctane or 1, 12-diaminododecane, may be added to the solution to begin linking the HNS matrix.

In another embodiment, TEOS and (3-aminopropyl)triethoxysilane (ATEOS) can combine by undergoing the hydrolysis and condensation reactions to form a silica based matrix. The ATEOS brings a primary amine on its 3 carbon side chain that can react with the epoxide functional groups of GPTMS eliminating the need for a diamine cross linker. For example, the HNS coating may comprise a siloxane solution containing ATEOS, TEOS, hydrophobic silane (HS), ethanol, and water. This siloxane solution is combined with a GPTMS solution, NPA (1-Propanol), IPA (2-Propanol, Isopropyl alcohol), and 1-Butanol. In such an embodiment, the epoxide group in GPTMS and the primary amine in ATEOS react and covalently bond to form a branching silica-based network.

It is noted that many substrates are capable of being coated with an HNS material without any pretreatment or prior conditioning. However, several substrates may benefit from a pre-treatment prior to coating with an HNS material. In one embodiment, polycarbonate is pre-treated with an amino siloxane such as ATMOS or ATEOS. The amino siloxane may be rubbed onto the surface of the polycarbonate during which the amine functional groups bond to the surface leaving the alkoxide groups of the siloxane oriented away from the surface. These alkoxide groups then easily react with the siloxane compounds of the present disclosure to form an HNS film that is covalently bonded to the substrate. In another embodiment, surfaces with relatively few hydroxyl groups such as metals or quartz can be hydroxylated in an oxidative environment, such as a mixture of sulfuric acid and hydrogen peroxide, prior to coating. These hydroxyls can then undergo condensation with the present technology to form an HNS film covalently bonded to the substrate.

In various embodiments, different molar ratios of the individual components may be employed. Table 1, below, sets forth several non-limiting examples of ratios of HNS materials, where: TEOS is tetraethylorthosilicate; GPTMS-(3-glycidyloxypropyl)trimethoxysilane; MTEOS is methyltriethoxysilane; POTS is 1H,1H,2H,2H-perfluorooctyltriethoxysilane; OTEOS is octyltriethoxysilane; ATMOS-(3-aminopropyl)trimethoxysilane; ODA is 1,8-diaminooctane, AcOH is glacial acetic acid; $H_2O$ is water; and EtOH is ethyl alcohol.

Consistent with the descriptions above, the HNS material may be produced using a sol-gel synthesis method that can be done with or without heat. The process includes the growth of a hydrophobic or hydrophilic siloxane chain, and may incorporate a cross linker to form a network of siloxane chains and/or a binding agent to help the sol adhere to the coated medium. The growth of hydrophobic siloxane chains may be accomplished using alkylsiloxane molecules undergoing hydrolysis and condensation reactions. These reactions can be acid- or base-catalyzed to speed up the growth of the hydrophobic siloxane chains. A cross linker may be added to allow the hydrophobic siloxane chains to branch out and form covalent bonds in a complex three dimensional network. This phenomenon increases the hardness of the resulting materials (e.g., the coating 100), forms pores in the sol allowing space for the embedding of other nanoparticles, and may provide properties such as increased anti-reflectance to the sol.

The HNS coating may be used in a variety of applications and placed on a variety of substrates or structures, such as indicated above. The following are a few non-limiting examples of applications of the HNS material: PV modules; maritime applications including coating the hulls of ships or as a chemical resistant coating for mine destroying equipment (e.g., an HNS combined with copper nanoparticles may be used on iron clad ships to provide improved impact resistance and reduced water drag while also using the antibiological properties of copper to inhibit barnacle adherence or other marine life growth); electronic displays (e.g., cell phone displays, smart phone displays, tablet displays, televisions, computer displays, other touchscreen displays) including both OEM products as well as aftermarket protective screens for electronic displays; various glass materials and applications including glass used in ovens and microwave ovens, chemical glassware (e.g., laboratory ware), housewares, automotive windows, windows used in

TABLE 1

| TEOS | GPTMS | MTEOS | POTS | OTEOS | ATMOS | ODA | AcOH | $H_2O$ | EtOH | Example Use(s) |
|---|---|---|---|---|---|---|---|---|---|---|
| 1 | | | | | | | 0.03 | 8 | 5 | scratch resistance |
| 1 | 0.67 | 2.33 | | | | | 0.06 | 8 | 4 | clear coat |
| 1 | 0.67 | 2.33 | | | | | 0.72 | 250 | 154 | impact resistance and hydrophobicity |
| 1 | 0.67 | 2.33 | | 0.0165 | | | 0.72 | 250 | 154 | hydrophobicity |
| 1 | 0.67 | 2.33 | 0.04 | | | | 0.72 | 250 | 154 | hydro/oleophobicity |
| 1 | 0.67 | 2.33 | | | | 0.33 | 0.72 | 250 | 154 | cross-linking |
| 1 | 0.67 | 2.33 | | | 0.139 | | 0.5 | 125 | 154 | cross-linking |
| 1 | 1 | 1 | | | 1 | | 2.78 | 200 | 144 | cross-linking |

Referring to FIG. 1, in various embodiments an HNS material 100 may be coated onto a substrate 102 to form a structure 104 in a variety of applications. The coating 100 may provide impact resistance, scratch resistance, corrosion resistance or act as an optical enhancing coating (e.g., an antireflective coating such as described in further detail below). The substrate 102 may be glass, such as with a PV module, a window or an electronic display, or it may comprise other materials including, for example, metals, metal alloys, ceramic, porcelain, plastics, semiconductors, natural stone, wood, composite materials or combinations of such materials. Additionally, the HNS material 100 may or may not include embedded nanoparticles (such as OENPs) depending on an intended application of the HNS material.

residential and commercial applications, structural glass, bullet proof glass, explosion proof and impact resistant glass, museum glass; aircraft glass; coatings for aircraft propellers and blades; as a coating for painted surfaces such as automotive paint or road paint; as an anti-graffiti coating; coatings for data discs (e.g., BLU RAY/CD/DVD coatings to help prevent scratching); neon tubing (e.g., to keep rain from depositing on it); eye glasses (e.g., as anti-scratch and/or anti-reflective coating (ARC) on reading, prescription, and sun glasses); plungers (for hydrophobic/scratch resistant properties), toilet bowls and toilet seats; fish tank coatings; floor coverings; coatings for metallic and semiconductor materials including, for example, stainless steel, iron, germanium, silicon, aluminum, indium phosphide, gallium arsenide, tin, lead and other similar materials; and coatings for composite materials such as fiberglass or carbon fiber materials. Several non-limiting examples are discussed in further detail below.

Optical Examples Including PV Modules:

In one embodiment of the present disclosure, a silica-based coating may be used in conjunction with various optical applications due to its high transparency and ability to host other components such as OENPs as noted above.

Considering PV modules, commercially available PV modules are currently about 15%-20% efficient in their conversion of sun light photon energy into electrical energy under optimal conditions. The optimal output of electrical energy of PV modules is dependent on a variety of factors, for example: the angle of incidence (AOI) of the sun light as it strikes the PV module, the loss of photon energy due to reflection from the surface of the PV module's protective glass, loss due to reflection from the PV cell itself, the level of energy present in the photons entering the PV cell, the ability of the PV cell to convert photons of light into electrical energy, and the age and condition of a PV module or its components.

At best, the adoption of such solar technology has been slow and expensive. Payback periods range upwards of 20 years to offset the cost of installation and operation of PV electrical generation systems. At present only about 1-2% of electrical energy is generated by solar based technology. State and Federal Governments, as well as utility companies, have offered financial incentives to foster adoption of such systems, but adoption is still lagging. Improving the efficiency of solar energy systems will reduce the payback period and help to make solar energy more acceptable to consumers. Many of the numerous installations already in existence operate at efficiencies lower than that of newer technologies. It is expensive to simply replace old installations of PV modules, thus making it desirable to improve the efficiency of previously installed PV modules.

Most PV modules lose about 0.5-1.0% of their generating capacity per annum. After 10 years there is a noticeable and significant deterioration in energy production approaching 10%. This causes economic loss to the owner of the solar-based electricity generating system ("solar generating system") as capacity decreases. One of the factors associated with the economic loss associated with solar generating systems is the deterioration of the protective cover glass. Abrasions due to weather conditions and impact with small abrasive objects such as sand, as well as cumulative damage from cleaning of surface of the glass (often with brushes), results in lower electricity generating capacity of the solar generating system.

Additionally, many PV modules have glass covers which did not receive an ARC during manufacturing. This can result in 2-4% (or more) of light being reflected away from the PV module and thereby reduce power generating capacity.

Because crystalline silicon (used to make PV module) is very expensive, wafers are often cut too thin for optimal photon absorption and considerable light loss occurs when the PV module reflects back uncaptured photons resulting in a loss of on the order of 3-8% of electrical generating capacity. If however, the individual elements were sliced with proper thickness, the resulting PV module would not be economically competitive.

Using a silica-based composition such as described above, a coating may be used in conjunction with PV modules to improve efficiency of such modules. For example, as previously noted, a plurality of OENPs may be embedded or distributed throughout a matrix of the silica-based material. In one embodiment, cross-linked silica compounds may serve as a matrix for OENPs, such as gold nanoparticles (or other OENPs, such as described in U.S. Patent Application Publication No. 2014/0174534, the disclosure of which is incorporated by reference herein in its entirety), such that the OENPs are spaced substantially uniformly with minimal agglomeration of OENPs. The OENPs may be used to form a plasmon that cause the strong forward light scattering required to solve many problems including the thinness of the wafers. The incorporation of a plasmon has been shown to overcome initial levels of light loss from reflection, such as discussed with regard to Table 2 hereinbelow.

It is noted, that, as used herein, a PV module (or solar module or solar panel) refers to a device having one or more photovoltaic cells (PV cells), which may be electrically connected in parallel, to convert light into electric energy. Nonlimiting examples of PV modules are described in the previously incorporated U.S. Patent Application Publication No. 2014/0174534.

In one embodiment, the size, shape and density of the OENPs may be determined with guidance from Maxwell's equations and the calculations of mathematician Gustav Mie. In one example embodiment, the OENPs include substantially spherical gold nanoparticles having an average diameter of approximately 200 nm. Such a relatively large nanoparticle has very high degree of light scattering and a low degree of absorption, making it suitable for redirecting photons back towards the photovoltaic component of a PV module. It is believed that the combination of an HNS compound, combined with OENPs (such as gold nanoparticles), when applied to a given PV module, may yield an increase of up to 5% in solar generation power.

It is noted that different PV modules may respond differently to different OENPs. For example, it is believed that gold OENPs produce greater efficiency when used in association with a PV module formed of a crystalline silicon material, while silver, copper or aluminum OENPs will produce greater efficiency when used in association with a thin film PV module. In other words, the selection of the OENPs may be tailored (in material composition, size, shape, etc.) such that their intrinsic spectral resonant point matches the sensitivity of the PV module.

In accordance with one embodiment, a mixture of the HNS compound and the OENPs may be prepared using a double axis centrifugal mixer, wherein OENPs are introduced into the HNS compound to achieve a statistically even spacing and desired pitch of the OENPs. Considering an example where the OENPs are spherical, with each exhibiting an average specified diameter, with the OENPs being substantially uniformly distributed throughout the matrix material, and considering a "monolayer" of OENPs in a given coating being used (wherein the thickness of the monolayer is approximately equal to the thickness of an average diameter of a the OENPs), the spacing or distribution of the OENPs may be described in terms as a "fill factor" of the OENPs and expressed, for example, as $NP/cm^2$. The desired pitch or distribution may be determined by precision serial dilutions of various counts of the specific OENPs being utilized.

In one non-limiting example, the OENPs may include generally spherical particles exhibiting an average diameter of approximately 120 nanometers (nm) with a fill factor of approximately $8.3 \times 10^7$ nanoparticles/$cm^2$. This would result in a center-to-center spacing of about 1,110 nm. It is also noted that this might be expressed as a volume fraction of approximately 10%.

In another non-limiting example, using substantially spherical OENPs having a diameter of approximately 10-300 nm, the OENPs may exhibit a center-to-center spacing of approximately 23-690 nm. This again assumes the OENPs to have a volume fraction of about 10% when forming a monolayer in the host environment (the coating). For a 20% volume fraction, the center-to-center and surface-to-surface spacing will reduce to 16-493 nm and 6-193 nm, respectively. The results depend on the distribution pattern of the particles aside from their sizes and volume fractions in the material coating.

In yet another embodiment, OENPs may have a center-to-center spacing of approximately 100 nm to approximately 700 nm.

In one example embodiment, OENPs may include spherical silicon nanoparticles. For example, spherical silicon nanoparticles having a diameter in the range of approximately 50 nm to 200 nm may be dispersed throughout a matrix of HNS material.

In another embodiment, OENPs may include silver nanoplates or nanodiscs. For example, silver nanoplates having a diameter in the range of approximately 30 nm to 200 nm and a height in the range of approximately 5 nm to 100 nm may be dispersed throughout a matrix of HNS material.

In yet another embodiment, OENPs may include spherical silver nanoparticles. For example, spherical silver nanoparticles having a diameter in the range of approximately 20 nm to 200 nm may be dispersed throughout a matrix of HNS material.

In yet another embodiment, OENPs may include spherical aluminum nanoparticles. For example, spherical aluminum nanoparticles having a diameter in the range of approximately 10 nm to 200 nm may be dispersed throughout a matrix of HNS material.

In other embodiments, other types of OENPs may be used. Additionally, different types and sizes of OENPs may be employed together (e.g., both gold and silver nanoparticles used at the same time in the same HNS matrix).

Prior to mixture of the OENPs with the silica based solution, small amounts of surfactants may be introduced into the OENP stock and the OENP stock may be subjected to ultrasonic energy to breakup any large agglomerations of OENPs which would be occlusive to passing photons and might not allow the primary passage of light to the PV module. Some non-limiting examples of surfactants that may be used include 2,4,7,9-Tetramethyl-5-decyne-4,7-diol and other nonpolar surfactants. Non limiting anionic surfactants include polyoxyethylene (20) sorbitan monolaurate (currently commercially available as Tween®20 from Sigma Aldrich) while non-limiting examples of cationic surfactants include dodecyltrimethylammoniumbromide. Additionally, prior to mixture into the HNS compound, the OENPs may be characterized using an electron microscope to verify that the OENPs satisfy size and/or quality requirements.

The HNS compound/OENP mixture is applied to a PV module (e.g., to the glazing) while in the sol state. The chemistry of the HNS compound remains a liquid until it comes in contact with glass (e.g., the glazing of the PV module) and small amounts of certain volatile substances such as ethanol escape the mixture by evaporation. Thus, the HNS compound is suitable for both OEM applications as well as for enhancing or retrofitting previously installed PV modules. When used to retrofit existing PVs, application of the mixture may be accomplished in situ, meaning that the PVs do not need to be removed from their installation. In doing so, the HNS/OENP mixture may be applied at temperatures of, for example, approximately 20° C. and up (e.g., up to 150° C.) and still harden when it contacts the glass and attaches thereto.

In one embodiment, HNS materials may be applied to a substrate, such as the glazing or other optical pane of a PV module, by way of spray coating. After thoroughly cleaning the glass/glazing and making sure it is free of dirt and bonded minerals from rain fall or other precipitation, the HNS compound/OENP mixture is applied in the liquid state. The sprayer may incorporate the use of ultrasonic energy to perfect the spray pattern and to further inhibit agglomerations of nanoparticles (e.g., OENPs) and to provide an even spray pattern. In one embodiment, an airless sprayer may be used for application of the mixture, the sprayer including a series of ultrafine nozzles laid out substantially linearly with respect to the width of the solar panels to be sprayed or coated. The careful measurement of spray volume and the rate of nozzle movement determine the application of a precision depth of the HNS compound. In accordance with other embodiments, roller application, flood coating, spin coating and dip coating may also, or alternatively, be utilized to apply the OENP enhanced solution to a given structure.

As noted above, hydrophobic, hydrophilic or oleophobic chemistry may further be added to the solution. The use of hydrophobic, hydrophilic or oleophobic chemistry additives may decrease the buildup of precipitation deposited minerals and reduce the tendency of water or oil to form a bead on a PV module which would otherwise reduce power generation by the PV module. Either form of chemistry (hydrophobic, hydrophilic or oleophobic) will also greatly reduce the volume of water remaining on the solar panel after a storm.

The use of an HNS compound/OENP mixture provides numerous benefits. For example, the mixture reacts (and hardens) at a low temperature when applied to a substrate and certain volatile substances escape. In contrast, most types of durable antireflective compounds require a thermal catalyst that is activated at several hundred degrees Fahrenheit above ambient. Such materials are unsuited to retrofitting existing PV modules with an antireflective media. The HNS compound of the present disclosure may be configured to react at safe temperatures similar to those experienced by sunlight falling on an object.

As previously noted, the HNS, when applied to the glazing of the solar panel may also provide a measure of impact resistance. Thus the force dissipation of a small layer of HNS is greater than that possible with glass. As will be discussed further below, this is demonstrated through a drop ball test using protected and unprotected glass.

One of the leading causes of solar panel failure is damage from impact of such things such as hail and flying debris. While HNS coatings may not protect from all forms of impact, they can mitigate the effects of impact on the glass surface. In various applications, including when photovoltaics are used to power satellites or space vehicles, impact mitigation from tiny high velocity objects is very important.

As previously noted, the surface of a cover glass or glazing found on installed PV modules is typically abraded over time and ceases to optimally transmit the light impinging upon it. HNS compounds of the present disclosure, when in liquid form, are capable of filling minor abrasions and, to an extent, are capable of restoring the surface and clarity of the abraded glass. Depending upon the extent of the abrasion over several years, the HNS compounds may restore 1-3% of performance due to clarifying and repairing the abrasions of the cover glass.

While the HNS compound is dispersed onto a panel of glass used for solar panel covers (in a liquid state), the HNS compound bonds intimately with the surface of the glass and creates a new optically transparent surface for older PV modules. It is noted that coatings according to various embodiments of the present invention exhibit a transparency that is greater than glass (i.e., the coating transmits more light than bare glass).

As an anti-reflective coating, the HNS compound/OENP mixture prevents light from being reflected off the surface of the low iron and other glass and redirects it to the photovoltaics of the PV module, which may result in a power boost of approximately 1-4%. Moreover, it has been observed that the addition of an HNS/OENP coating can improve the transmission of light through the glass or glazing. For example, without an HNS coating, a glass substrate may transmit approximately 91 or 92% of incident light while, on the other hand, after an HNS coating has been properly applied to the glass substrate, the combined glass and coating will transmit greater than 99% (e.g., approximately 99.92%) of incident light.

When OENPs are arranged by random probability in an appropriate medium such as an HNS, having an appropriate index of refraction, a plasmon meta-body is formed. The size of the nanoparticles and the average distance between nanoparticles, known as pitch, will determine the amount and distance of forward light scattering. It is noted that forward scattering is defined as the scattering of an electromagnetic wave, such as light, by a medium such that the angle between the initial and scattered wave is less than 90°.

Light passing through the plasmonic device will first preferentially scatter into the substrate, and the subsequent angular redistribution of the scattered light will be bounced back and forth between this plasmonic device and the interfaces below it, ultimately lengthening the optical path inside the PV module. Hence light exiting the photovoltaic cell (of the PV module) will be returned back to the photovoltaic cell rather than exiting the PV module and being lost. This process is known as light trapping and the end result is that the typical loss of reflected light from the photovoltaic is minimized due to the light trap. Through the use of light trapping technology, photons reflected out of the photovoltaic device may get redirected back into the device for another opportunity of utilization and may result in an additional 3-10% gain in performance of the device.

In certain embodiments, in order to provide a coating that produces a plasmon, metallic nanoparticles may be embedded with the HNS material and substantially uniformly spaced at a rate of approximately 10% by volume. The diameter of the nanoparticles may be selected, at least in part, based upon the distance between the light trap (the coating containing the OENPs) and the photovoltaic cell. Likewise, the pitch of the nanoparticles may also be selected based, at least in part, upon the desired distance between the light trap and the photovoltaic.

All layers of materials between the light trap (e.g., the layer containing the OENPs) and the photovoltaic cell must be taken into consideration in any calculations to determine the size and pitch of the nanoparticles. This would include such layers of materials as glass and air.

Due to the nature and expense of the synthetically grown silicon crystal slices from which crystalline PVs are made, they tend to be sub optimally thin, causing the crystal slices to be suboptimal for photon utilization and allowance of upwards of 10% of the entering photons to be reflected out of the thin slice of silicon PV. Through the use of light trapping technology, photons reflected out of the photovoltaic cell may get redirected back into the cell for another opportunity of utilization and may result in an additional 3-10% gain in performance of the cell.

It is noted that in conventional AR coatings, owing to the high refractive index of c-Si, about 30% of the incident light is reflected back at air/c-Si interface. For example, in order to trap more light and improve efficiency of a PV cell, anti-reflection coatings are used on c-Si solar cells. The anti-reflection coating may consist of one to several layers of different materials such as silicon nitride, titanium dioxide, zinc sulfide, or magnesium fluoride, for example. A single layer AR coating, which is commonly used on commercial modules, can only be tuned for a single wavelength of light. Multilayer AR coatings have broadband performance, but are expensive and, thus, are rarely used commercially. Using HNS materials to form AR coatings in various structures provides numerous advantages as will be discussed below.

Figure 2:
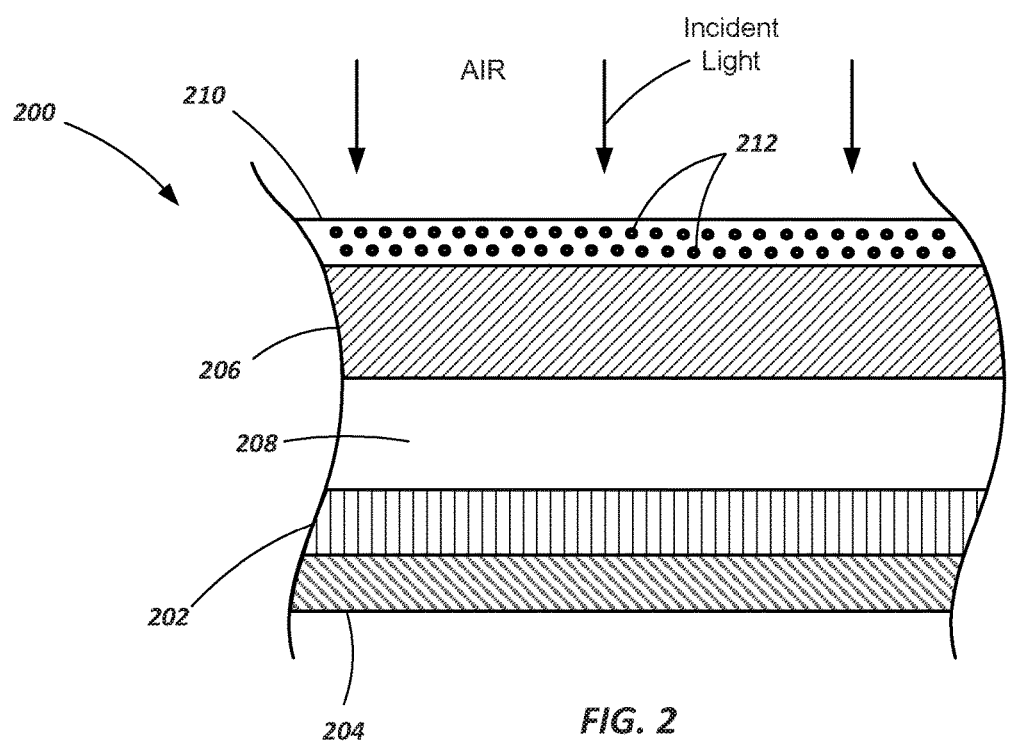
FIG. 2 is cross-sectional view of a portion of a photovoltaic module in accordance with an embodiment of the present disclosure.

Referring to FIG. 2, an example of a PV module 200 is shown having a crystalline photovoltaic cell 202 disposed on a polymer back plate 204. A cover glass 206 (e.g., a low iron cover glass) is positioned above the photovoltaic cell 202 such that there is an air gap 208 or some other transparent material gap therebetween. A coating 210 is formed on the cover glass 206, the coating 210 comprising an HNS compound with a plurality of OENPs 212 embedded therein, the coating being prepared and applied in a manner such as described above. In one embodiment, the HNS/OENP coating 210 may be formed as an antireflective coating (ARC) having a desired index of refraction and a specified thickness depending, for example, of the wavelength of light that is expected to be transmitted through the coating, glass and to the underlying PV module. For example, in one embodiment, it may be desirable to configure the thickness or depth of the coating 210 to be approximately equal to $\frac{1}{4} \times n \times \lambda$, wherein "n" is the index of refraction of the ARC and wherein "λ" is the wavelength of incident light. In an embodiment where only a single ARC is employed, it may be desirable for the index of refraction to be equal to the square root of the index of refraction of the underlying glass pane (e.g., the cover glass 206). When using multiple layers of ARCs and/or multiple layers of glass, further consideration must be given to the refractive indices of each layer.

Figure 3:
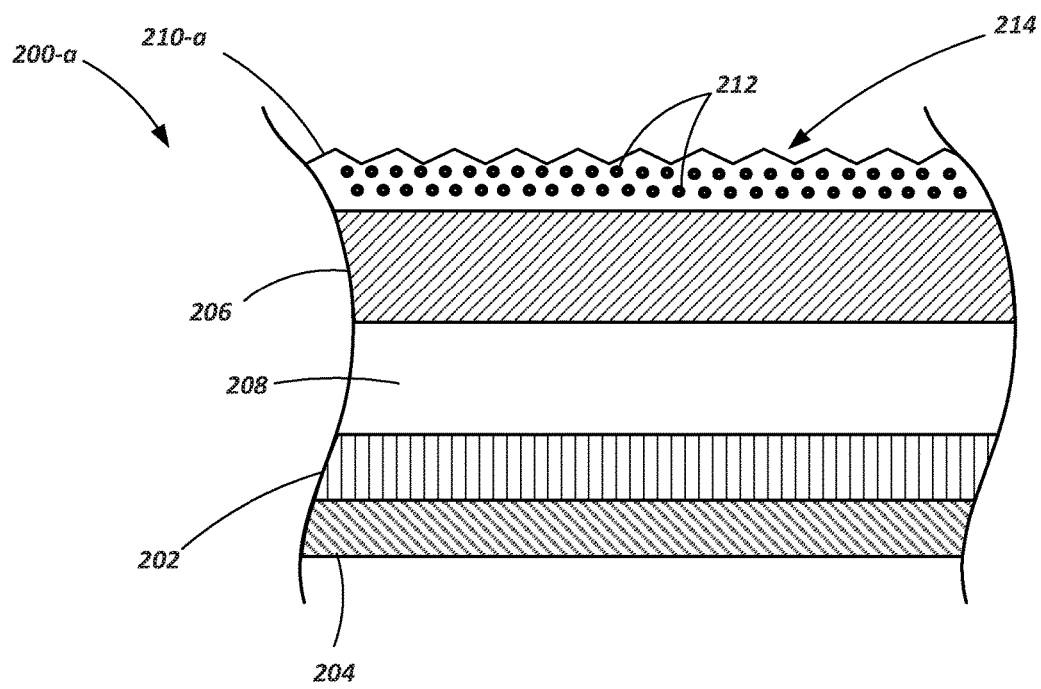
FIG. 3 is cross-sectional view of a portion of a photovoltaic module in accordance with an embodiment of the present disclosure.

Referring briefly to FIG. 3, another example of a PV module 200-a is shown having components similar to that described with respect to the embodiment associated with FIG. 2. However, the coating 210-a shown in FIG. 3 has been embossed or otherwise physically modified such that it presents an undulating or uneven surface 214. For example, an embossing roller may be used as the applied material becomes more solidified but is yet quite plastic or in the semi sol state. In other embodiments, the undulating surface 214 may be formed using a heated roller or stamp on a surface of a substantially hardened or solid state. Yet in other embodiments, the uneven surface features 214 may be formed using a chemical etchant, using a laser or using other appropriate manufacturing processes.

The geometry of the uneven/undulating or "embossed" surface may be, for example, triangular shaped or saw-tooth shaped rows. In other embodiments, the surface may include other geometries including pyramidal shaped features, inverted pyramids, nanobowls, features having three perpendicular planar surfaces (3PP), or other geometries. In other embodiments, one or more surfaces of a coating associated with the PV module 200-a may be configured as a Lambertian surface which are generally matte or diffuse. In another embodiment, one or more surfaces may exhibit a reversed impression of that generally exhibited by a Blu-ray disc (BRD). The embossed/uneven surface(s) 212 may provide additional enhancement in collecting and trapping light for the PV module 200-*a*.

In some embodiments, a separate layer or coating may be used to provide the embossed surface. In other words, compounds other than the HNS compound may be used as a base layer in which the embossing features may be formed. The base layer may be formed of compounds comprising, for example, vinyl-terminated poly(dimethylsiloxane) (PDMS) cross linked with tetrakis(dimethylsilyl)orthosilicate. This hydrosilyation reaction can be catalyzed by (but is not limited to) cis-Dichlorobis(diethylsulfide) platinum (II). Thus, the surface features (e.g., embossed layer) may be formed as an integral aspect of the HNS coating, or it may be formed as an addition to the HNS coating as a separate layer or coating of material.

Figure 4:
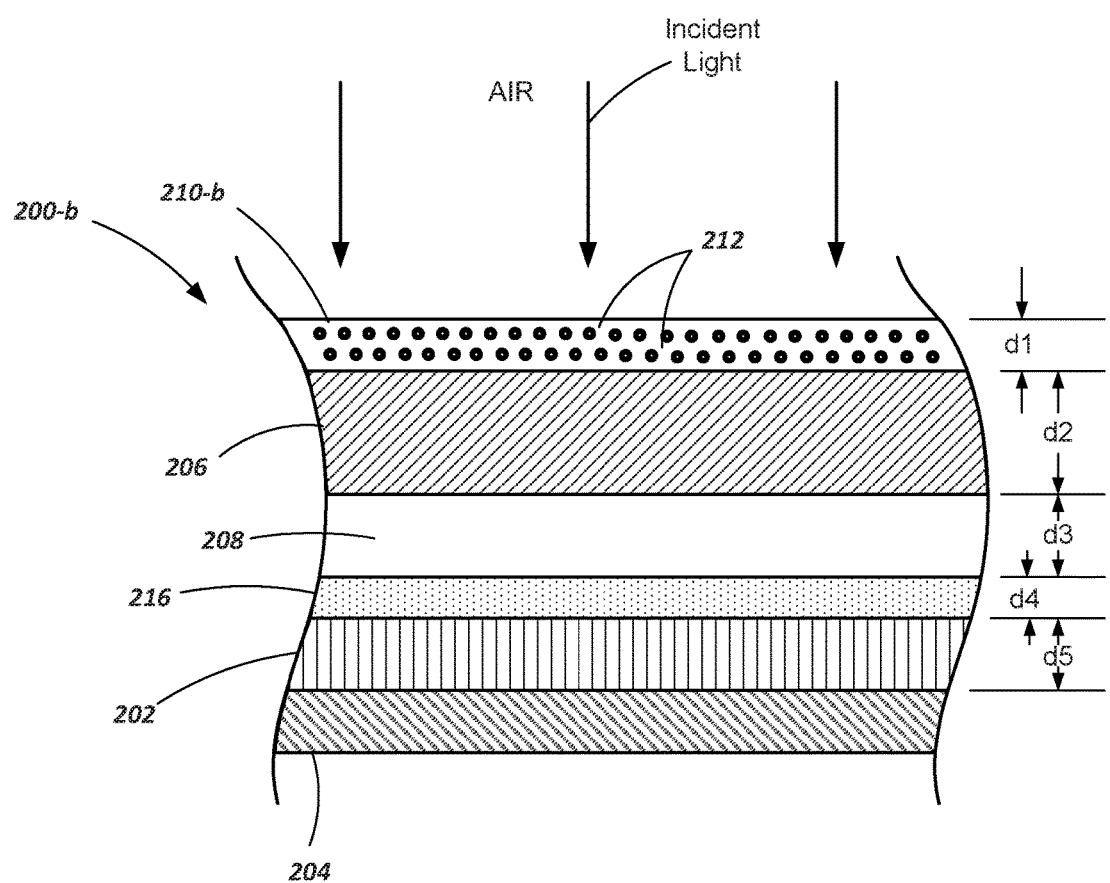
FIG. 4 is cross-sectional view of a portion of a photovoltaic module in accordance with an embodiment of the present disclosure.

Referring to FIG. 4, another embodiment is shown of a PV module 200-*b* having an antireflective coating (ARC) 210-*b* on a glass layer 206 of the PV module 200-*b*. The ARC 210-*b* may be formed according to any of the previously described embodiments. In one particular embodiment, the ARC 210-*b* may include $SiO_2$ having a plurality of OENPs 212 such as gold, silver, aluminum and/or silicon nanoparticles embedded therein. The ARC 210-*b* may exhibit a thickness or depth d1 of approximately 140 nm to approximately 200 nm. The ARC 210-*b* may exhibit an index of refraction of approximately 1.45. The ARC 210-*b* is bonded to a glass layer 206, such as has been described herein, with the glass exhibiting a thickness or depth d2 of approximately 2 to 5 millimeters (mm). The glass layer 206 may exhibit an index of refraction of approximately 1.5. Below the glass layer 206 is an air gap 208 which may exhibit a thickness or depth d3 of approximately 1 to 20 µm with an index of refraction of 1. Below the air gap 208, another antireflective coating (ARC) 216 may be employed which may or may not include OENPs. In one embodiment, the second ARC 216 comprises TiO2 without the addition of OENPs, exhibiting a thickness or depth d4 of approximately 100 to 200 nm and an index of refraction of 2.5. The second ARC 216 is placed directly atop the PV cell 202, which may include a polysilicon PV material exhibiting a depth d5 of approximately 1 mm and having a refractive index of approximately 3.5. Below the PV cell 202 is a back reflector which may include, for example, a material comprising silver.

Figure 5:
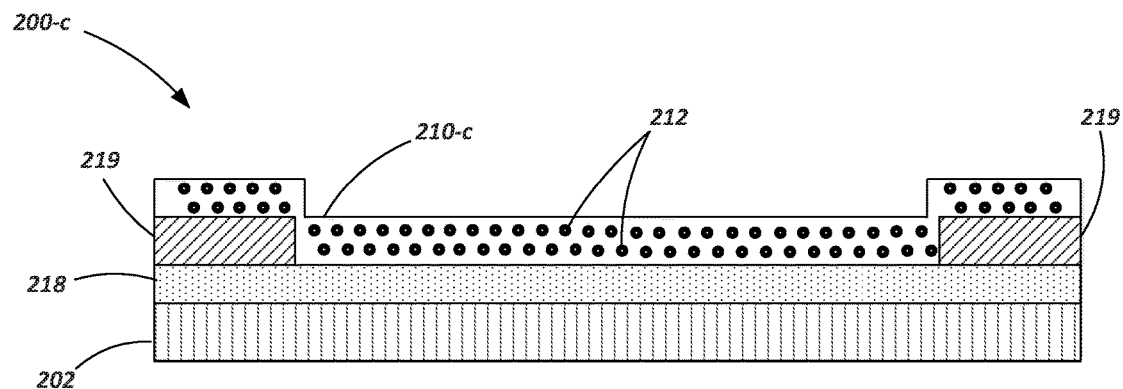
FIG. 5 shows a portion of a photovoltaic module in accordance with an embodiment of the present disclosure.

Referring to FIG. 5, another embodiment of a PV module 200-*c* includes a PV cell 202 having a conventional AR coating 218 disposed directly thereon. In accordance with one embodiment of the present disclosure, an HNS coating 210-*c* may be disposed over the conventional AR coating 218 as well as over contacts 219 associated with the PV cell 202. The HNS coating 210-*c* may be include embedded OENPs such as previously described.

Figure 6:
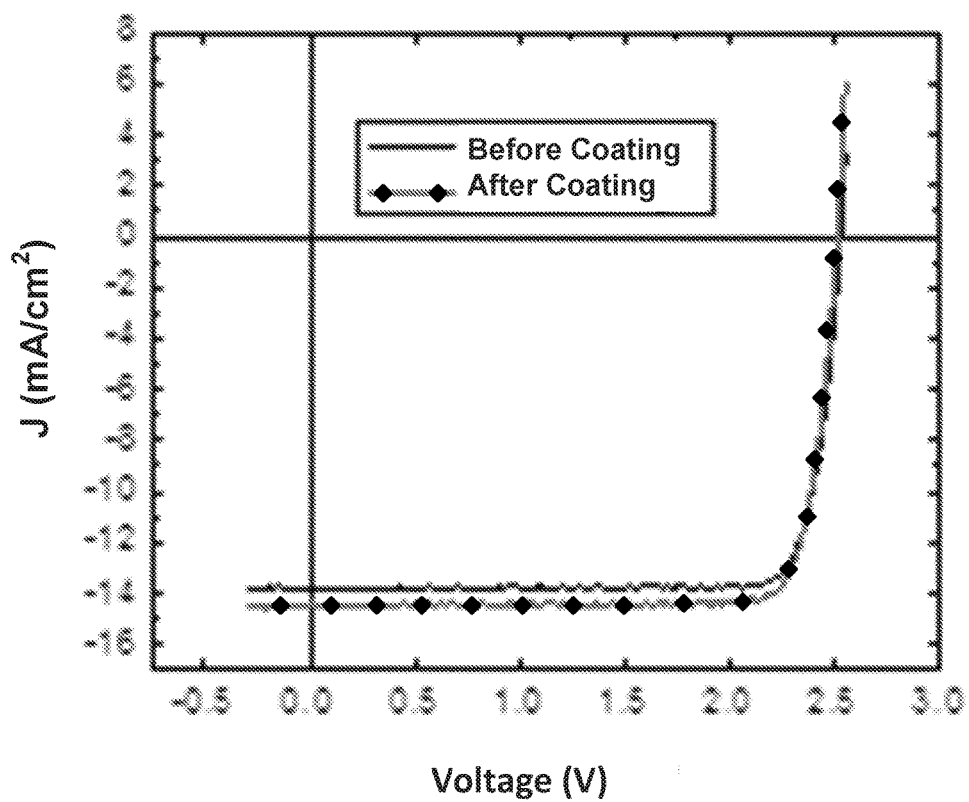
FIG. 6 is a J vs V curve showing results of tests associated with a photovoltaic module in accordance with an embodiment of the present invention.

In one particular example embodiment, the HNS coating 210-*c* includes a silica nanoparticle matrix embedded with OENPs 212 such as metallic or semiconducting nanoparticles. Substantially spherical silicon nanoparticles may be in the range of 50 to 150 nm in diameter can be introduced into the HNS coating to provide a PV enhancement via "forward light scattering." Forward scattering allows more light to be captured by a PV. Experimental evidence of this property is supported by Lumerical™ mathematical modeling software, which models the interaction of light with matter as well as measured experimental results that were obtained at OAI in Silicon Valley. In one particular example, a 70-250 nm thick HNS coating 210-*c* embedded with 100-500 nm spherical silicon nanoparticles, spaced approximately 300 nm apart, will produce an excellent ARC. The specific composition described above was shown to increase the short circuit current by 4.85% (relative) and the photoconversion efficiency by 1.19% (absolute). FIG. 6 shows the J-V performance curve of such a PV cell employing a triple junction photovoltaic cell and compared to the performance of a similar PV module that does not employ an HNS coating. Table 2 below also compares the results, showing open circuit voltage ($V_{OC}$) in volts, short circuit current ($J_{SC}$) in mA/cm$^2$, fill factor (FF) in percentage (FF being a ratio of the maximum power from the PV cell to the product of open circuit voltage and short circuit current), and PV module efficiency ($\eta$). Additional gains may be achieved using HNS ARC(s) on the more common silicon single junction photovoltaics.

TABLE 2

|  | $V_{OC}$ (V) | $J_{SC}$ (mA/cm$^2$) | FF (%) | $\eta$ (%) |
| --- | --- | --- | --- | --- |
| Before Coating | 2.524 | 13.81 | 84.31 | 29.39 |
| After Coating | 2.509 | 14.48 | 84.16 | 30.58 |
| Net Change | −0.015 | 0.67 | −0.15 | 1.19 |

In some embodiments, it has been determined that cubical Si nanoparticles having approximate dimensions of 100 nm×100 nm×100 nm produce conversion ratios of photon to electron that are equal to, or in some cases better than, 100 nm diameter spherical silicon nanoparticles.

In other example embodiments, silver nano "-discs" or "-plates" may be embedded in the HNS matrix material. For example, in one embodiment, the silver nanodiscs may be approximately 30-200 nm diameter an exhibit a height of approximately 5-100 nm. Such a coating may be used, for example, in conjunction with silicon photovoltaics to produce results similar to those noted above.

The HNS coating 210-*c* may be applied to the PV cells by precision spraying, dip coating, blade coating, spin coating or simply wiping the solution on with a cloth. Coatings can be applied before contacts are applied to the PV cells or after.

Figure 7:
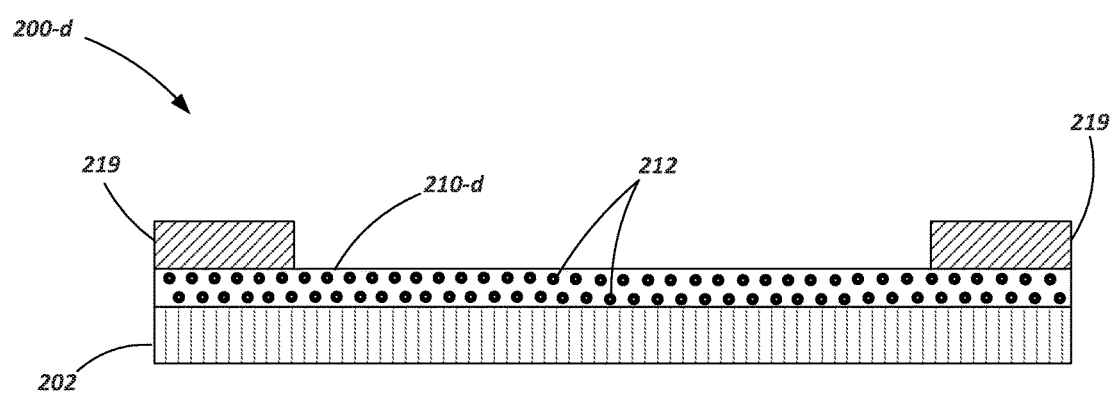
FIG. 7 shows a portion of a photovoltaic module in accordance with an embodiment of the present disclosure.

Referring to FIG. 7, another embodiment of a PV module 200-*d* is shown having a photovoltaic cell 202 and an AR coating 210-*d* disposed directly on a light gathering surface of the photovoltaic cell 202. The AR coating 210-*d* may be formed of an HNS material such as has been described herein. In one embodiment, HNS AR coatings have diameters of the OENPs from approximately 50 nm to approximately 200 nm, with period (or center to center spacing) of the OENPs from approximately 100 nm to approximately 500 nm and with the thickness of the HNS coating or film being approximately the same as the average diameter of the nanoparticles (e.g., within 50%).

Other Embodiments and Applications

HNS materials may be used in a variety of applications. Various substances may be added to give enhanced properties to the HNS. The properties in most cases can be cumulative when used in combination, although some properties may be somewhat, but not entirely, diminished when other substances are added to enhance specific properties. Properties which are antithetical are not usually used in combination. One embodiment where two formulations of HNS used in combination may be very beneficial is in the case where an antireflective coating is placed on the side facing outward of the glazing (or other transparent structure)

of a solar panel while a coating on the underside (opposite the outward facing side) confers significant break resistance to the glass or other covering of a solar panel.

Figure 8:
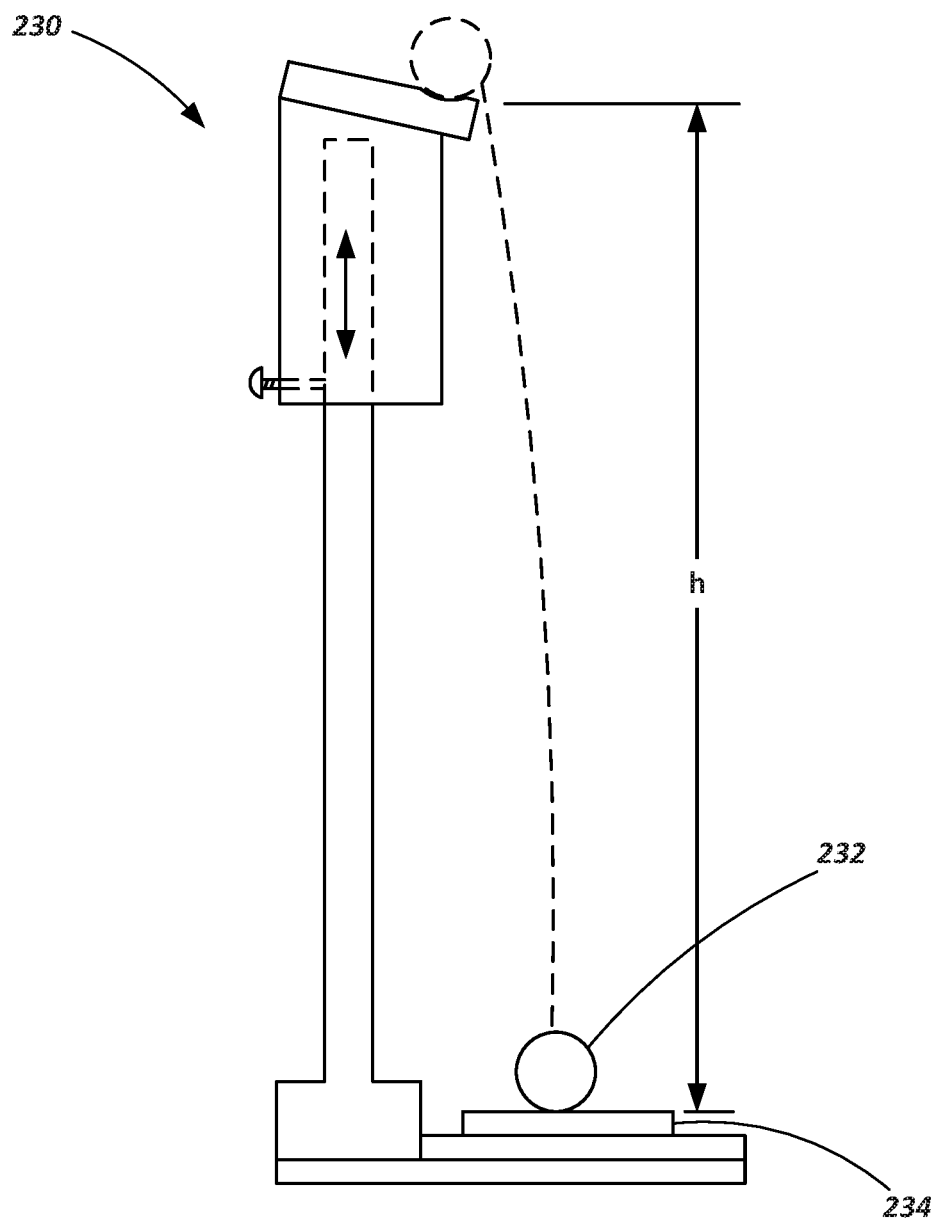
FIG. 8 is a schematic showing a testing procedure used in accordance with an embodiment of the present disclosure.

Impact Resistance:

As an example of the impact resistance provided by such an HNS coating, a drop ball experiment was conducted using a set up as shown in FIG. 8. The drop ball testing apparatus 230 including a spherical projectile 232, representing any of a variety of natural and man-made impact producing objects, which is dropped from various heights "h" and, accelerated by the force of gravity, impacts the surface of a glass substrate 234. A variety of sizes and weights of the dropped balls may be used in such a test. One can use Newtonian physics in analyzing the energy of the impact, as the kinetic energy in the ball at impact is equal to the potential energy of the ball prior to drop, (i.e., the mass of the sphere multiplied by the force of gravity multiplied by the height of the sphere or the distance that the ball will drop). In other words, the equation is: $KE=PE=mgh$ (where KE is kinetic energy, PE is potential energy, "m" is the mass of the ball, "g" is the gravitational constant, and "h" is the height of the ball when dropped relative to the top surface of the sample being tested). This equation is used to calculate the energy of impact in Joules (J). For instance, a ball dropped from 25 cm and having a weight of 0.4 kg will release potential energy of 1 J. If the sphere is dropped from a higher position, such as 100 cm, the resultant kinetic energy would be 4 J.

In one embodiment, drop-ball experiments utilized a 1 inch diameter, 65.65 gram stainless steel ball 232 which was dropped from varied distances "h" to determine the amount of energy required to break a low iron glass plate 234 having a thickness of approximately 3 mm. It was determined that an uncoated glass plate would break with the ball being dropped from a minimum height of approximately 12.4 inches (about 31.4 cm) such that the energy required to break the glass was approximately 0.202 J. The same test was conducted using low iron glass plates wherein an HNS coating of approximately 200 nm thickness was applied to the glass. It was determined that the coated glass broke when the ball was dropped from a distance of approximately 16.5 inches (approximately 41.9 cm) such that approximately 0.270 J of energy was required to break the glass. Thus, a coating of as little as 200 nm in thickness may provide substantial improvement in impact resistance (withstanding an impact delivering approximately 34% more energy) while also providing other benefits (e.g., optical enhancement, corrosion resistance) in a variety of applications.

Figure 9:
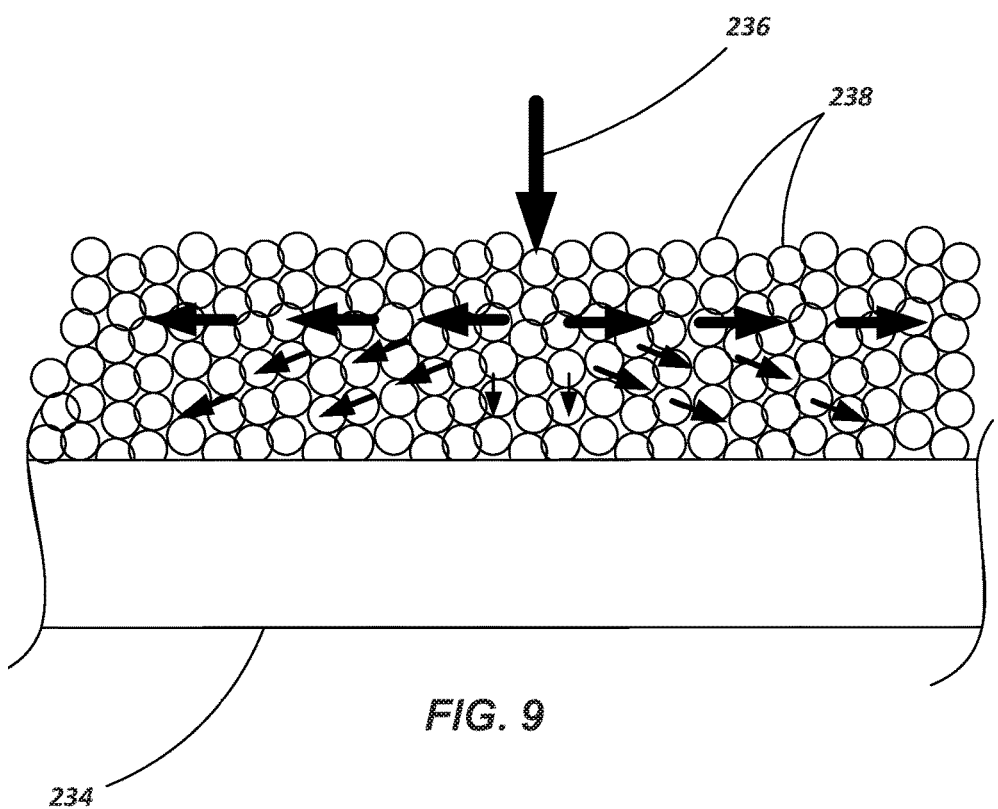
FIG. 9 is a schematic view of a portion of a coated substrate in accordance with an embodiment of the present disclosure.

As depicted in FIG. 9, it is believed that the energy of impact is dispersed molecularly such that only a small force component or force vector is transferred directly along the line of impact 236. Rather, the force is largely distributed through the mechanical or structural array of silica nano particles 238 of an HNS material (disposed on the glass substrate 234) with a methyl group attachment formed by MTEOS in combination with other chemicals to form a siloxane solution. The methyl group also engenders the attribute of hydrophobicity providing a dual benefit.

In one particular embodiment, the coating may be used by placing on a surface that is opposite from a surface where impact is anticipated. In the prior art, protective coatings are conventionally found on a protected object placed between the object itself and the anticipated impact of a destructive object. However, it has been determined that in certain instances a protective coating provides better protection on the backside of an object which it protects (i.e., on a surface opposite of the anticipated location of impact).

Analysis shows that before catastrophic failure of a glass plate, maximal stress in the plate a occurs on the back side (non-impacted surface) of the substrate. In one embodiment of the disclosure, the protection of low-iron glass is provided by placing a coating of HNS material on a surface opposite that where impact is anticipated. Other impact resistant embodiments may likewise include coatings on non-impact surfaces of materials other than glass.

Referring to Table 3 below, test results are shown for drop ball tests wherein a 65.9 gram ball was dropped from various heights (referred to in the table as "Break Point/cm", meaning the height, in centimeters, from which the ball was released so as to cause the glass to break) and indicating the amount of energy (referred to as "Break Point/J", meaning the energy in Joules required to break the glass). The test was conducted for: 1) uncoated glass having a thickness of approximately 3.16 mm; 2) glass having an HNS coating on the top surface (i.e., the surface impacted by the drop ball), where the glass was again approximately 3.16 mm thick, and the HNS coating was approximately 20 microns (with a tolerance of +/−5 microns) in thickness; and 3) glass having an HNS coating on the bottom surface (i.e., the surface opposite that which is impacted by the drop ball), where the glass is again approximately 3.16 mm thick and the HNS coating was approximately 20 microns (with a tolerance of +/−5 microns) in thickness.

TABLE 3

| Trial | Uncoated | | Front Side | | Back Side | |
|---|---|---|---|---|---|---|
| | Break Point/cm | Break Point/J | Break Point/cm | Break Point/J | Break Point/cm | Break Point/J |
| 1 | 25 | 0.161 | 50 | 0.323 | 50 | 0.323 |
| 2 | 35 | 0.226 | 25 | 0.161 | 55 | 0.355 |
| 3 | 20 | 0.129 | 20 | 0.129 | 75 | 0.485 |
| 4 | 25 | 0.161 | 45 | 0.291 | 25 | 0.161 |
| 5 | 30 | 0.194 | | | 30 | 0.194 |
| average | 27 | 0.174 | 35 | 0.226 | 47 | 0.304 |
| % increase | | | 30 | | 74 | |

Although, it may be viewed as counter intuitive, the comparison of multiple trials of uncoated glass, compared to glass coated only on the front, and glass coated only on the back side required significantly differing amounts of energy to cause breakage. All coatings were done in a similar manner to a similar thickness of 20 microns+/−5 microns from a single batch of HNS material. Whereas a calculated energy of approximately 0.174 J caused the uncoated glass to break, glass coated on the front (impacted) side required an average energy of 0.226 J to break, and glass coated on the back (non-impacted) side required an average energy of 0.304 J to break the glass.

Stated another way, the glass coated on the front (impacted) surface required an average level of energy that was approximately 130% of the energy needed to cause breakage of the uncoated glass, and the glass coated only on the back (non-impacted) surface required 174% of the energy required to break uncoated glass.

Therefore, the glass coated with HNS material on the back, non-impacted surface clearly provided significantly more breakage protection than glass coated on the front side or glass not coated at all.

In another drop-ball experiment, tests were conducted to confirm previous results on glass slides having a coating face up, face down, as well as to observe performance of a double sided coating. In the experiment, it was observed that uncoated borosilicate microscope slides (approx. 1 mm thick) that were impacted with a stainless-steel ball that is 0.625 inches in diameter broke with the ball being dropped from an average height of 18.2±6.9 cm. Microscope slides coated with an HNS film approximately 10-15 µm thick, wherein the film was facing up and towards the side of impact, broke when the ball dropped from an average height of 17.25±5.9 cm, corresponding to a 5.2% decrease in the average break height. Microscope slides with an HNS film approximately 10-15 µm thick, wherein the film was facing down and on the side opposite of impact, broke when the ball was dropped from an average height of 33.5±14.4 cm, corresponding to an 84.1% increase in the average break height. Microscope slides with two HNS films, each being approximately 10-15 µm thick,—one on each side of the glass (i.e., on both the impact side and on the nonimpact side)—broke when the ball was dropped from an average height of 37.4±18.0 cm corresponding to a 105% increase in the average break height as compared to an uncoated slide.

In other examples, it has been determined that a coating of HNS having a thickness of approximately 20 µm placed on the side of the glass opposite from the side of impact may enhance the impact resistance of microscope slides (1 mm thick) by as much as 300%.

It is noted that, where a projectile impact is anticipated, yet driven by a force other than that of gravity or where gravity is not significant, the Newtonian equation describing the kinetic energy can be described as $KE=\frac{1}{2}mv^2$ wherein KE is the kinetic energy usually described in Joules, m is the mass of the object, and v is the velocity of the impacting object. Sometimes this is expressed in terms of momentum in which case the $KE=p^2/(2m)$ wherein KE is kinetic energy described in terms Joules, p is momentum, and m is mass of the object.

The degree of impact resistance is most influenced by the thickness of the HNS relative to the thickness and strength of the substrate, however even very thin layers provide improved impact protection. The concentrations of the precursors used to make an HNS material can easily be varied and various functional compounds added to the solution to produce embodiments that are highly useful in a number of ways. In one embodiment, HNS can be used to impart a greater impact resistance on a number of breakable substances, either vitreous (e.g., glass) or non-vitreous materials while also providing other advantages (e.g., AR coatings).

Thus, for example, HNS can give a solar module or PV module cover glass a significant enhancement in impact resistance, which is a common problem plaguing solar modules due to hail and other impact damage. Of course, impact resistance is not limited to terrestrial applications.

In yet other embodiments, in addition to providing impact resistance, additives (e.g., embedded nanoparticles) may be embedded into the HNS matrix as performance enhancements including, for example, ultraviolet light attenuation. In such an embodiment, nanoparticles such as cerium oxide may be embedded in the HNS matrix material.

Hydrophobicity/Oleophobicity/Hydrophilicity:

In one embodiment, a Tri-Alkoxy(Alkyl)Silane, such as Triethoxy(Octyl)Silane and/or triethoxy(methyl)silane, is added to the basic HNS formulation, which results in a hydrophobic material. When applied to the protective glazing of solar panels, other glass, or materials exposed to a rainy, or dusty environment, hydrophobic HNS films can reduce the amount of airborne dirt which adheres to the glass, and thereby produces a "self-cleaning" surface. Said surfaces tend to be washed clean rather than spotted by mineralization normally deposited by precipitation.

Figures 10A, 10B:
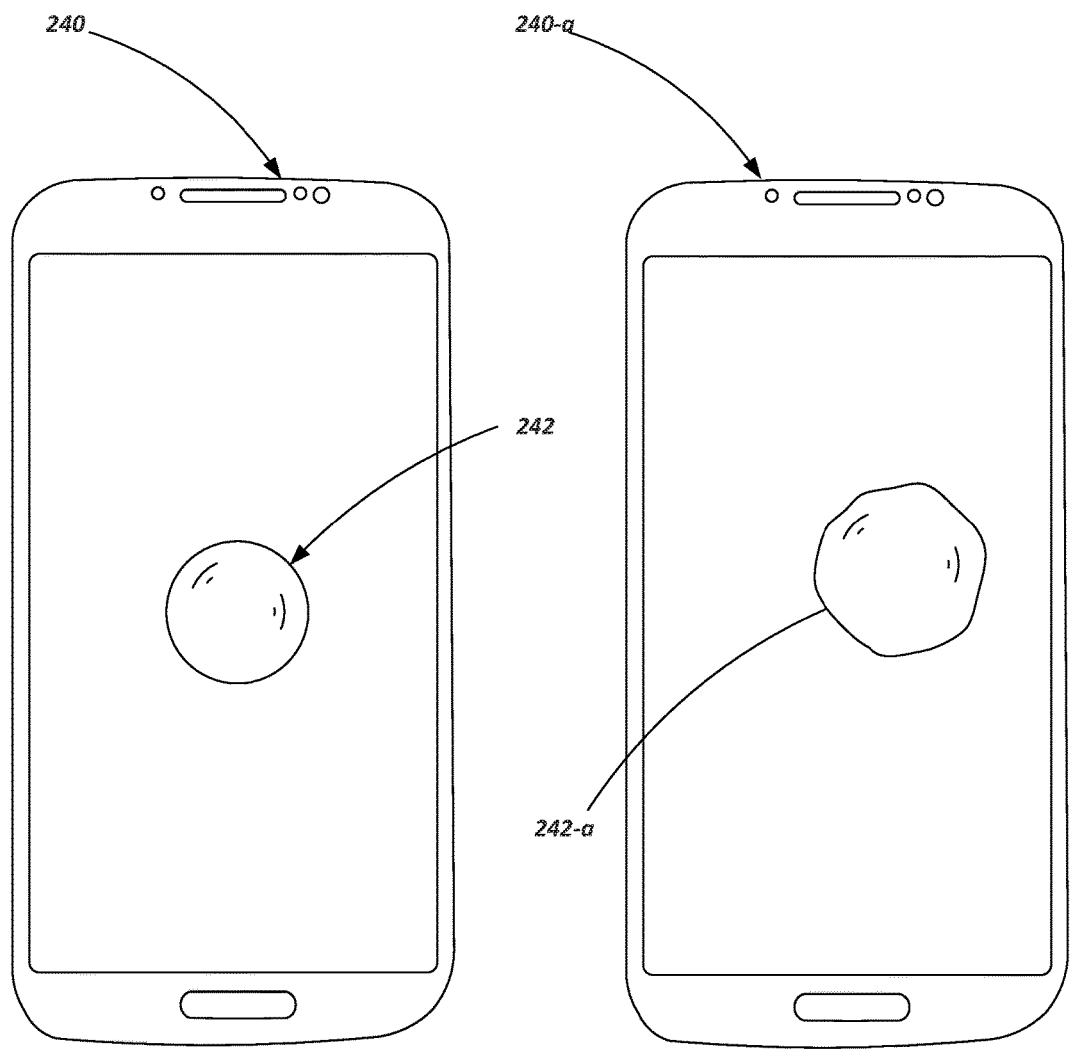
FIGS. 10A and 10B show a smart phone screen cover with FIG. 10A having a coating in accordance with an embodiment of the present disclosure.

The effectiveness of the hydrophobicity is shown in FIGS. 10A and 10B which depict a commercially available cover plate 240 for a smart phone wherein the cover 240 shown in FIG. 10A includes an HNS coating having a hydrophobic additive while the cover 240-a shown in FIG. 10B is uncoated. A volume of 1 ml of water 242 (and 242-a) was dispensed onto each of the cover plates 240, 240-a. The hydrophobicity of the HNS coating on the cover 240 (FIG. 7A) caused the water to bead up more and cover a smaller area on the cover 240 as compared to the uncoated cover 240-a (FIG. 7B). Water contact angles on various embodiments of hydrophobic HNS coated glass surfaces have been observed to range from 78.6 to 106.3 degrees.

Thus, the HNS coating may also be considered to provide a "self-cleaning" property where water or other fluids bead up on the surface of the coating and roll off with minimal effort required at keeping the surface clear. Further, the HNS coating may also provide an anti-fogging property that additionally helps to keep the surface clear. Such properties clearly provide advantages to various types of structures including windows, display glass and a variety of other optical applications.

In another embodiment, the HNS may be made both hydrophobic and oleophobic, when it is also important to resist the attraction of oils. This embodiment finds applications in which oils from fingerprints are undesirable such as a cell phone, computer screen, or any device having a touchscreen. The protective glass on various touchscreens may be further enhanced by a coating with films that have the antireflective, impact resistant, and hydrophobic/oleophobic properties. The introduction of oleophobicity to the films may be accomplished by adding a perfluoro(alkyl)silane such as 1H,1H,2H,2H-Perfluorooctyltriethoxysilane to the basic HNS formulation.

It is also noted that the use of a hydrophilic additive in an HNS coating (e.g., polyethylene glycol), rather than a hydrophobic material, may also provide a self-cleaning effect. For example, a hydrophilic coating may cause water to spread out relatively evenly over a surface so that it may then be broken down by a photocatalytic process to help clean the surface of the coating. For example, UV light from the sun may break down organic deposits on the coating surface.

Low-Temperature Hardening, Non-Sputtered Antireflective Coatings:

Prior art formulations of sol-gel siloxane chemistry used as an ARC often require high temperatures of upwards of 200° C. after application of the coating to a given structure in order to cause the hardening. This incompatible with many applications wherein the presence of heat sensitive components make it prohibitive to use a process relying on the application of high temperatures. For example, it becomes prohibitive to apply prior art ARCs to a PV module after initial assembly because exposure to high temperatures would result in damage to the electronics, photovoltaics or other components of the PV module.

Additionally, low temperature processes aren't always amenable to providing coatings for certain structures. For example, it is simply impractical to place a finished and previously installed PV module into a vacuum chamber to receive an ARC by a sputtering process. In fact, very few, if any, other methods of applying an ARC exist that could conceivably be completed on installed PV modules without exposing them to upwards of 200° C. curing temperatures, and/or removing them and placing them in a vacuum chamber to be sputter coated.

The HNS materials described herein are characterized by the lack of high heat treatment (e.g., >65° C.) requirements. Mildly elevated temperatures, such as found in bright sunlight, however, will tend to accelerate the transition and shorten curing time. The transition from a solution to a solid can, none-the-less, take place at room temperature (27° C.). Terminal hardness may take several days to weeks to achieve, but a working hardness is typically achieved within a few hours.

Countless PV modules or solar panels have been produced and are in service without the panel cover glass having an ARC. Without an ARC, approximately 4% of sunlight is reflected off the top surface of the solar module cover glass. An AR coating constructed from HNS cures in-situ, without damage to PV module components from high heat, and provides a productivity boost to aging solar panels. Moreover, minor flaws in the glass from scratches resulting from blowing sand or cleaning brushes may be filled in and made smoother, so that even more useful light gets transmitted to the solar panel it covers.

A Screen/Display Protector:

The protection of various electronic screens from impact damage as well as diminished readability as a result of the accumulation of abrasion, dirt, debris and fingerprints are predicted to be a major use for HNS materials (either as an OEM coating on a display, or as an aftermarket screen protector). As previously noted, HNS materials may exhibit hydrophobic and/or oleophobic properties in addition to its native ability to resist impact, abrasion and give strength to the cover glass of various displays such as are on cell phones, tablets, and computers. Micro-display screens found on watches and various electronic devices are well suited to the properties of HNS materials.

A Coating for Composites and Polymer Base Materials:

HNS materials may be used to coat optically clear and other polymers used, for example, in aircraft canopies. This can provide a durable material which is more scratch resistant and impact resistant than polymers alone. In addition, hydrophobicity, hydrophilicity, and/or oleophobicity can be particularly useful in keeping aircraft and terrestrial vehicles observation windows free of dirt oil and other debris. Optical windows on tactical vehicles, which are often made of polycarbonate, may also be enhanced and made more durable. A coating of an HNS material can provide significant benefit to many areas of an aircraft which are subject to a variety of damages from blowing sand, pelleting rain at supersonic speeds, etc. When it is important to keep observation ports or windows free from the accumulation of dirt and debris as well as provide a clear view during a rainstorm without the use of windshield wipers, HNS can provide such a benefit to the user along with added impact resistance.

Communications and Extraterrestrial Structures:

Extraterrestrial Satellites can greatly benefit from a coating of an HNS material. Such a coating provides a significant amount of impact resistance with a relatively low mass and with minimal lift-off weight. Moreover, satellite communication antennas and other antennas also benefit from HNS materials as a protective coating against the accumulation of dirt, debris, and corrosion. It is costly to maintain the functionality of antennas or other structures located in extremely harsh environments. As a deterrent to ultraviolet light damage, cerium oxide, titanium dioxide, and or/zinc oxide may be added, in various amounts, to the HNS material as noted above. Added UV protection is particularly useful in the prevention of deterioration of photovoltaic cells on extraterrestrial vehicles, spacecraft, and satellites.

Dental Environment or Application:

Hydrophobic, hydrophilic and/or oleophobic versions of HNS materials may be used as a durable surface prevent or minimalize degradation of a dental prostheses that might occur through normal wear. HNS materials may also be used to repair damaged surfaces of a dental prostheses.

In other embodiments, HNS materials may be used as a tooth sealant for natural and or artificial teeth. HNS materials may assist in providing an environment for both artificial and natural teeth which is more resistant to plaque buildup than either the natural or artificial tooth. HNS materials may be also used as a protective coating on various dental equipment and also render the dental equipment easier for cleaning and decontamination.

Adhesive Applications:

In many instances, HNS materials make an excellent adhesive or bonding agent. Transparency, hydrophobicity, oleophobicity, and impact resistance are desirable characteristics in many environments where adhesives are used. A variation on the basic formula can make the resulting material somewhat porous. When used as an adhesive, HNS materials may make an ideal material for wound closure. Porosity may be altered by varying certain parameters such as age time, pH values, amount of water or ethanol, or altering the reaction temperature.

UV Inhibiting Applications:

In the prior art, it has been customary to place an ultraviolet inhibiting material such as cerium oxide in the protective cover glass of triple junction photovoltaic cells where it is desirable to reduce ultraviolet radiance impinging upon the photovoltaic cells. Such materials are usually added to glass at about 1 mol. %. As a significantly less expensive option, 1 mol. % to 5 mol. % cerium oxide may be added to the HNS base. In some instances, this entirely eliminates the necessity of a separate protective cover glass to protect the PV cell from UV and impact damage. This same technology may be applied to thin-film photovoltaics, thus eliminating the need for an expensive supporting framework and associated protective glazing (as with other applications not including UV inhibitors). Likewise, this technology may be applied to conventional single junction silicon photovoltaics. The HNS material may also be used to impart a certain degree of impact resistance to the otherwise unprotected photovoltaic.

Clear Coat Applications:

There are many surfaces to which it is a common practice to add a clear coat made from polymers such as polyurethane, shellac, varnish, or other transparent materials. Such clear coated objects are usually softer, less durable, and less impact resistant than a coating made from an HNS material. As a few non-limiting examples, application of an HNS material as a clear coat may be used on objects such as: automobile bodies to prevent paint damage and deterioration; marine metals to maintain luster and give protection against salt spray; external polymer lighting lenses; ornamental or utilitarian ceramics; protective coatings for ceramic or glass food containers; household ceramics such as plates, cups, and bowls etc.; and wooden furniture within the home or out-of-doors and exposed to harsh environments.

Applications with Wood:

HNS materials may be used as a coating on wood to add enhancement in a number of ways including the protection of woods from impact destruction. Additionally, HNS materials may be used to protect wood from discoloration caused by ultraviolet degradation by using NES formulated with cerium oxide, titanium dioxide, and/or zinc oxide, or another UV inhibitor. When used as a coating, HNS materials may also be used to protect wood from termite or similar wood destroying insects, providing protection to the wood without the need to employ toxic chemicals.

In another embodiment, a coating of HNS materials may provide protection to wood from ignition and burning for a specified amount of time. Additionally, additives may be provided to the base HNS material to curtail or delay combustion of wood.

Application as a Fire Retardant and/or Insulating Material:

HNS may be embedded with an insulative material such as porous perlite or an aerogel providing the coating with excellent insulative properties as well as a limited degree of flame protection.

When it is desirable to produce a quality long-lived insulation ice box or ice chest, a product made with an HNS material and perlite (or similar materials) may produce a product having improved insulative properties as compared to, for example, expanded bead polystyrene.

In another embodiment, building materials constructed from a mixture of HNS materials and perlite may provide a high-quality insulation material for large capacity refrigeration cold rooms.

Coatings on Natural Fiber and Cloth:

Coatings of HNS materials may be used to enhance the properties of fibers and cloth in such applications as a sizing agent on a cotton or other natural fiber cloth to exhibit a somewhat stiffer "hand" which is more permanent than a starch-based sizing and will exhibit permanent press features for many machine items of washing. Thus, HNS materials may be used to inhibit wrinkles or create a "permanent press" type material.

HNS may be used to add additional protection against penetrating armaments when, for example, multiple layers of ballistic nylon armor are coated. Additionally, as a fabric coating, HNS may be made somewhat porous allowing body heat and moisture to escape while the coating gives added protection against penetrating armament.

Application with Optical Lens:

HNS materials are useful as a coating on optical lenses to impart antireflective properties, impact resistance, hydrophobicity, oleophobicity, and ultraviolet radiation protection. The use of HNS materials provide protection to the eyes when used on eyeglasses (prescription or otherwise) and yet are much more durable than conventional optical coatings which may damage easily with improper cleaning or environmental micro abrasion. HNS materials are highly robust by comparison.

HNS coatings may be used for any type of optical lens including, but not limited to, spectacles, goggles and other protective eyewear. In some embodiments, nanoparticle and/or other nano or micro additives may be introduced into the HNS material to effect specific exclusions or reduce certain wavelengths of unwanted light from a variety of sources including but not limited to lasers, ultraviolet radiation in extraterrestrial applications as well as earthbound applications Applications for Ballistics and High Speed Projectiles:

In some embodiments, HNS materials may be use to add strength or other desired characteristics to armament and related devices. For example, in one embodiment, HNS materials may be used in combination with bulletproof glass to enhance impact resistance to breakage. In one embodiment, HNS materials may be used on its own, cast to form a lightweight bulletproof glazing—whether used for a window or for any other part of a vehicle. In another embodiment, HNS materials may be used as a coating on both the interiors and exteriors of military vehicles to add impact resistance and contribute to antiballistic armament.

As indicated HNS materials may also be used on aircraft canopies as an AR coating, as a hydrophobic coating, and/or as an oleophobic coating. Further, HNS materials may be used as a medium or carrier for nano and/or micro additives to exclude various wavelengths of light and to enhance UV protection in addition to adding fundamental impact resistance.

In other embodiments, HNS coatings may provide wear and abrasion resistance to materials or structures associated with radar evading or stealth operating vehicles.

Cast HNS materials may be used to preclude or impede penetration of projectiles from firearms. HNS coatings may offer additional protection to high-velocity helicopter blades including improved protection from damage by ordinary raindrops or airborne particulates such as sand.

Marine Applications:

Marine vessels, ships, boats or similar structures may be coated with HNS materials that are embedded with a biological deterrent. For example, copper nanoparticles may be added to HNS materials such that the resulting coating may server to prevent or inhibit the attachment of mollusks and other marine creatures. Since the majority of the copper nanoparticles are bound by the HNS, it is far less likely to cause harbor copper pollution than copper containing paints or copper plates attached to ship sides or other copper anti-mollusk attachment devices. When an HNS coating is used in conjunction with hydrophobic chemistry, HNS materials will also serve as a friction reducing agent for marine vessels as they pass through the body of water.

Beauty and Skin Care Applications:

In some embodiments, HNS materials may be used as nail polish fortifiers or bases that prevent breakage and peeling.

In other embodiments, formula variations may enable treatments for burn victims and numerous therapeutic and cosmetic treatments involving skin healing, restoration, and topical treatment for various skin disorders wherein nanoparticles of curative agents are embedded in the HNS base.

Applications for Concrete Reinforcing Steel:

Reinforced concrete bridges, highways and a variety of buildings and structures employ reinforcing metals (e.g., steel bar, often called "rebar") embedded in the concrete. Such reinforcing members can present certain long-term concerns wherein small amounts of moisture penetrate the concrete and contribute to the oxidation of the embedded steel rods, rebar, nuts, and bolts. HNS materials may be coated on such members to mitigate corrosion and degradation thereof. In some embodiments, the concrete itself may also be sealed using HNS formulas. During periodic maintenance, HNS may be used to fill cracks or other pitting within concrete which might otherwise lead to penetration by water and the resultant oxidation of the steel components. Some additional strength may also be imparted to the structure through the use of HNS materials.

Additional Applications and Environments of Use:

In one embodiment, HNS materials may be used as a protective coating on vessels which transport biohazardous waste as added insurance against the vessel being breached.

In one embodiment, HNS materials may be used for a protective coating of laboratory vessels to render them more chemically inert and/or easier to clean.

In one embodiment, housewares, dish sets, baby bottles, may be rendered easier to clean by HNS coatings, utilizing significantly less water and detergents than conventional housewares.

In one embodiment, HNS materials may be used as a sealer for ceramic tile grout to make it easy to clean and resist mildew.

In one embodiment, the interiors of ceramic toilets may be coated with HNS to enhance their cleanability and improve their resistance to staining.

In one embodiment, HNS materials may be used to coat the inside of sewer pipe and various forms of piping as a protective agent against build up an occlusion by foreign material.

In one embodiment, HNS materials may be used to coat the interior of metallic piping to make it more chemically inert.

In one embodiment, HNS materials may be used as a preservative coating for ceramic objects of art. Additionally, HNS materials may be used as a restorative composition and an agent for broken ceramic objects of art.

In one embodiment, HNS materials may be used as a coating to preserve petroglyphs and other artwork of indigenous people.

In one embodiment, HNS materials may be used as a protective coating for both hard and soft shell luggage to reduce damage inflicted by luggage handlers and through general use.

In one embodiment, HNS materials may be used to coat a wide variety of clothing accessories, shoes, boots, belts, wallets and purses to preserve the finish and make them less susceptible to damage from a variety of sources.

In one embodiment, a thin coating of HNS material may be used to protect or restore glass store fixtures and the associated metal framework.

All forms of glass doors (or windows), including shower doors, are rendered less harmful in the advent of breakage by thermal tempering of the glass. However, tempering increases the internal pressure of the glass door and makes them more vulnerable to accidental breakage. In certain embodiments, HNS materials may be used as a protective coating against impact damage of glass doors or windows (on either impact side, non-impact side, or both). The doors may be also made more hydrophobic and/or oleophobic for ease of cleaning.

In one embodiment, HNS materials may be used to treat windows of any sort or variety to render them more impact resistant to flying debris in windstorms and be made hydrophobic to have a higher degree of self-cleaning during a rainstorm.

In one embodiment, thermoplastic or paper dinnerware may be coated with HNS materials to give strength, resilience and an improved cosmetic appearance (e.g., the appearance of the thermoplastic actually being made from thin glass).

In certain embodiments, HNS materials may be used as a bonded cover for graphene in a plurality of applications.

Chemical Ratios in One Embodiment:

In one embodiment, an HNS material includes of a combination of siloxane compounds where the total moles of siloxane compounds is approximately 5-50 mole % TEOS, with TEOS being in the range of approximately 20-25 mole % TEOS in one particular embodiment. Methyl triethoxysilane (MTEOS) may be present in the HNS material in an amount of approximately 50-90 mole %, with MTEOS being present in the range of approximately 50-60 mole % in one particular embodiment. GPTMS may be present in the HNS material in an amount of approximately 5-25 mole %, GPTMS being present in the range of approximately 15-20 mole %.

In one particular embodiment, water may be present in the HNS material with a molar ratio of 5-100 times the total number of moles of siloxane compounds and, in one particular embodiment, with water being present with a ratio of 50-75 times the total number of moles of siloxane compounds. Such an embodiment may also contain ethanol with 1-5 times the volume of water and, in one particular embodiment, with 1-2 times the volume of water. Additionally, such an embodiment may contain an acid, such as hydrochloric or acetic acid, to maintain a pH range of 2-6 in one embodiment, or a pH range of 3-5 in another particular embodiment.

Another embodiment may contain, in addition to the components listed above, a trifunctional silica precursor containing a long-chain hydrocarbon such as tri ethoxy (octyl)silane or a fluorocarbon such as 1H,1H,2H,2H-perfluorooctyltriethoxysilane with up to 5 mole % of the total siloxane compounds. In one particular embodiment, the trifunctional silica precursor may be present in the range of approximately 0.5-1.5 mole %.

An Example of HNS Material Preparation:

In accordance with one embodiment, preparation of an HNS material may include adding water and alcohol to a reaction container along with a device for stirring. Siloxane compounds are added in the order: TEOS, MTEOS, and then GPTMS (others may also be added with or subsequent to the addition of GPTMS). When only TEOS, MTEOS and GPTMS are utilized as siloxane compounds, the solution may have a pH of approximately 5.5.

Acetic acid may then be added to lower the pH to approximately 4.

The solution is then stirred continuously at room temperature until the application is homogenous.

The solution is then stirred continuously for as little as one hour, and up to 1-7 days (or more) at a rate of between 100 and 1000 rotations per minute (RPM).

The solution may then be held without further mixing for 1-10 days prior to coating, depending on the desired characteristics.

If metallic or silicon nanoparticles are added (e.g., as OENPs or to obtain other performance characteristics), this may be done using various mixers. In one example embodiment, a dual-axis centrifuge may be used at a rate of approximately 2000 RPM for approximately 1-5 minutes.

The material may then be coated onto a number of substrates using one of the following non-limiting examples of application processes: spraying, roller coating, blade coating, drawbar or Meyers bar coating, or wire wound rods (such as are used for applying adhesives), dip coating, or other methods commonly used to apply coatings.

As noted with other applications, HNS materials may be cast in various shapes and may be used to construct a variety of objects both utilitarian and ornamental.

While the invention may be susceptible to various modifications and alternative forms, specific embodiments have been shown by way of example in the drawings and have been described in detail herein. Features, components or aspects of one embodiment may be combined with those of other embodiments. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A structure comprising:
   a substrate;
   a coating on a first surface of the substrate, the coating comprising a hybrid nanosilica (HNS) material produced by mixing tetraethylorthosilicate (TEOS), methyl triethoxysilane (MTEOS) and glycidoxypropyltrimethoxysilane (GPTMS).

2. The structure of claim 1, wherein the coating further includes a plurality of optically enhancing nanoparticles (OENPs) dispersed in the HNS material.

3. The structure of claim 2, wherein the plurality of OENPs include at least one of the group consisting of gold nanoparticles (NPs), silver NPs, aluminum NPs and silicon NPs.

4. The structure of claim 2, wherein the OENPs include spherical gold nanoparticles exhibiting an average diameter of approximately 30 nanometers (nm) to approximately 200 nm.

5. The structure of claim 2, wherein the OENPs include spherical silicon nanoparticles exhibiting an average diameter of approximately 30 nanometers (nm) to approximately 200 nm.

6. The structure of claim 2, wherein the OENPs include silver nanoplates exhibiting an average height of approximately 5 nanometers (nm) to approximately 100 nm and an average diameter of approximately 30 nm to approximately 200 nm.

7. The structure of claim 2, wherein the OENPs include spherical silver nanoparticles exhibiting an average diameter of approximately 80 nanometers (nm) to approximately 200 nm.

8. The structure of claim 2, wherein the OENPs include aluminum nanoparticles exhibiting an average diameter of approximately 10 nanometers (nm) to approximately 200 nm.

9. The structure of claim 2, wherein the center-to-center distance between the OENPs is approximately 100 nm to 700 nm.

10. The structure of claim 1, wherein the HNS material comprises a material that transitions from sol to gel at a temperature of approximately 60° C. or less.

11. The structure of claim 1, wherein the HNS material comprises a material that transitions from sol to gel at a temperature of approximately 20° C. to approximately 110° C.

12. The structure of claim 1, wherein the HNS material comprises a material that transitions from sol to gel at a temperature of approximately 150° C. or less.

13. The structure of claim 1, wherein the substrate comprises a glass material.

14. The structure of claim 1, wherein the substrate comprises a material including at least one of the group consisting of: wood, metal, polymer, ceramic and semiconducting material.

15. The structure of claim 1, wherein the coating is configured as an antireflective coating.

16. The structure of claim 1, wherein the structure includes a second surface opposite of the first surface, and wherein the second surface is anticipated to receive an external impact.

17. The structure of claim 1, wherein the coating further includes a plurality of nanoparticles embedded in the HNS material, the plurality of nanoparticles comprising at least one of cerium oxide, titanium oxide and zinc oxide.

18. The structure of claim 1, wherein the coating further comprises at least one of a hydrophobic agent, a hydrophilic agent and an oleophobic agent.

* * * * *